(12) United States Patent
Lee

(10) Patent No.: US 9,536,613 B2
(45) Date of Patent: Jan. 3, 2017

(54) SEMICONDUCTOR MEMORY DEVICE INCLUDING A 3-DIMENSIONAL MEMORY CELL ARRAY AND A METHOD OF OPERATING THE SAME

(71) Applicant: SK hynix Inc., Icheon-si, Gyeonggi-do (KR)

(72) Inventor: Hee Youl Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 5 days.

(21) Appl. No.: 14/617,246

(22) Filed: Feb. 9, 2015

(65) Prior Publication Data

US 2016/0071596 A1    Mar. 10, 2016

(30) Foreign Application Priority Data

Sep. 5, 2014    (KR) .......................... 10-2014-0119145

(51) Int. Cl.
| | | |
|---|---|---|
| *G11C 16/10* | (2006.01) | |
| *G11C 16/04* | (2006.01) | |
| *H01L 27/115* | (2006.01) | |
| *G11C 16/08* | (2006.01) | |
| *G11C 29/02* | (2006.01) | |
| *G11C 16/34* | (2006.01) | |

(52) U.S. Cl.
CPC ........... *G11C 16/10* (2013.01); *G11C 16/0483* (2013.01); *G11C 16/08* (2013.01); *G11C 29/024* (2013.01); *G11C 29/028* (2013.01); *H01L 27/11582* (2013.01); *G11C 16/3459* (2013.01)

(58) Field of Classification Search
None
See application file for complete search history.

(56) References Cited

U.S. PATENT DOCUMENTS

| | | | |
|---|---|---|---|
| 9,275,743 B1 * | 3/2016 | Lee .......................... | G11C 16/10 |
| 2011/0204420 A1 * | 8/2011 | Kim .................... | H01L 27/0688 257/211 |
| 2011/0211392 A1 * | 9/2011 | Kim .................... | G11C 16/0408 365/185.2 |

(Continued)

FOREIGN PATENT DOCUMENTS

| | | |
|---|---|---|
| KR | 1020120088360 A | 8/2012 |
| KR | 1020130037554 A | 4/2013 |

*Primary Examiner* — Harry W Byrne
*Assistant Examiner* — R Lance Reidlinger
(74) *Attorney, Agent, or Firm* — William Park & Associates Ltd.

(57) ABSTRACT

A semiconductor memory device may include a plurality of cell strings. Each of the cell strings may include at least one source selection transistor connected to a common source line, a plurality of memory cells connected to the common source line through the at least one source selection transistor. Each of the cell strings may include at least one source selection line connected to source selection transistors of the plurality of the cell strings. The semiconductor memory device may include peripheral circuit. The peripheral circuit may be configured to control the plurality of the cell strings. The peripheral circuit may be configured to perform a program on the source selection transistors connected to a selected source selection line by applying a program voltage to the selected source selection line among the at least one source selection line, and by applying a reference voltage to the common source line.

20 Claims, 13 Drawing Sheets

(56) References Cited

U.S. PATENT DOCUMENTS

| | | | | |
|---|---|---|---|---|
| 2011/0292725 A1* | 12/2011 | Choi | ............ | G11C 11/5628 365/185.03 |
| 2012/0195125 A1* | 8/2012 | Choe | ............ | G11C 16/0483 365/185.15 |
| 2012/0281475 A1* | 11/2012 | Oh | ............ | G11C 16/0483 365/185.17 |
| 2013/0114345 A1* | 5/2013 | Lee | ............ | G11C 16/0483 365/185.22 |
| 2014/0085989 A1* | 3/2014 | Fukuzumi | ............ | G11C 16/0483 365/185.23 |
| 2014/0334230 A1* | 11/2014 | Kwon | ............ | H01L 27/11582 365/185.11 |

\* cited by examiner

| Line | voltage |
|---|---|
| BL1~BLm | Vss |
| DSL1 | Vss |
| DSL2 | Vss |
| WL1 ~ WLn | Vss |
| PL | Vss |
| SSL1 | Vpgm |
| SSL2 | Vpih |
| CSL | Vss |

FIG. 7
FIG. 8
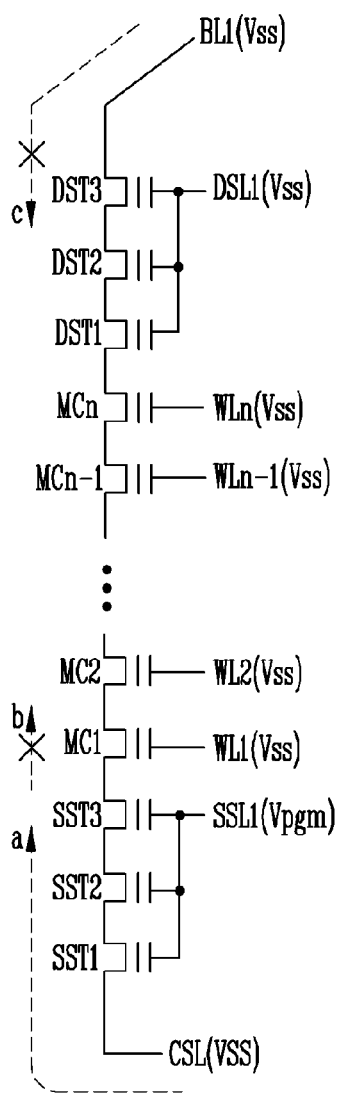
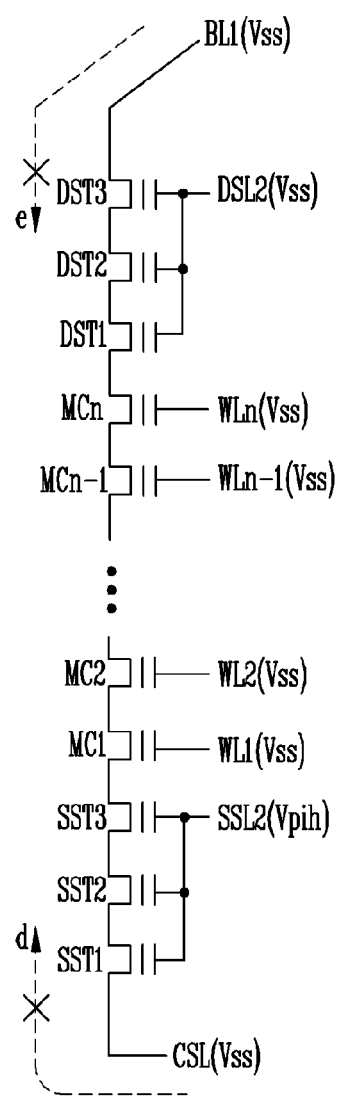

FIG. 9

| Line | voltage |
|---|---|
| BL1~BLm | float |
| DSL1 | float |
| DSL2 | float |
| WL1 ~ WLn | float |
| PL | float |
| SSL1 | Vpgm |
| SSL2 | float |
| CSL | Vss |

FIG. 10

| Line | voltage |
|---|---|
| BL1~BLm | Vss |
| DSL1 | Vtrn1 |
| DSL2 | Vtrf |
| WL1 ~ WLn | Vtrn2 |
| PL | Vtrn2 |
| SSL1 | Vpgm |
| SSL2 | Vpih |
| CSL | Vss |

SEMICONDUCTOR MEMORY DEVICE INCLUDING A 3-DIMENSIONAL MEMORY CELL ARRAY AND A METHOD OF OPERATING THE SAME

CROSS-REFERENCE TO RELATED APPLICATION

The present application claims priority to Korean patent application number 10-2014-0119145 filed on Sep. 5, 2014 in the Korean Intellectual Property Office, the entire disclosure of which is incorporated by reference herein.

BACKGROUND

1. Technical Field

The present application generally relates to an electronic device. More specifically, the present application relates to a semiconductor memory device including a 3-dimensional memory cell array and a method of operating the same.

2. Related Art

A semiconductor memory device is a memory device embodied using a semiconductor such as silicon (Si), germanium (Ge), gallium arsenide (GaAs), indium phosphide (InP), and/or the like. A semiconductor memory device may be classified as a volatile memory device or a nonvolatile memory device.

When the supply of electric power is shut down, data stored in the volatile memory is erased. The volatile memory device may include a static RAM (SRAM), a dynamic RAM (DRAM), a synchronous DRAM (SDRAM), and/or the like. Although the supply of electric power is shut down, the nonvolatile memory device maintains data stored within. The nonvolatile memory device includes a read only memory (ROM), a programmable ROM (PROM), an electrically programmable ROM (EPROM), an electrically erasable and programmable ROM (EEPROM), a phase-change RAM (PRAM), a magnetic RAM (MRAM), a resistive RAM (RRAM), a ferroelectric RAM (FRAM), and/or the like. A flash memory may be classified as a NOR type or a NAND type.

Recently, in order to increase the integration within a semiconductor memory device, a semiconductor memory device, having a 3-dimensional array structure, is being studied.

BRIEF SUMMARY

According to an embodiment, a semiconductor memory device may include a plurality of cell strings. Each of the cell strings may include at least one source selection transistor connected to a common source line, a plurality of memory cells connected to the common source line through the at least one source selection transistor. Each of the cell strings may include at least one source selection line connected to source selection transistors of the plurality of the cell strings. The semiconductor memory device may include peripheral circuit. The peripheral circuit may be configured to control the plurality of the cell strings. The peripheral circuit may be configured to perform a program on the source selection transistors connected to a selected source selection line by applying a program voltage to the selected source selection line among the at least one source selection line, and by applying a reference voltage to the common source line.

In an embodiment, the peripheral circuit may apply a program prohibition voltage to a non-selected source selection line among the at least one source selection line, and may prohibit the program on source selection transistors connected to the non-selected source selection line. The program prohibition voltage may be less than the program voltage.

In an embodiment, the peripheral circuit may float a non-selected source selection line among the at least one source selection line, and may prohibit the program on source selection transistors connected to the non-selected source selection line.

In an embodiment, each of the plurality of the cell strings may include at least one drain selection transistor connected between a corresponding bit line and the plurality of the memory cells, drain selection transistors of the plurality of the cell strings may be connected to a plurality of the drain selection lines, and memory cells of the plurality of the cell strings may be connected to a plurality of word lines.

In an embodiment, in the program, the peripheral circuit may apply the reference voltage to bit lines of the plurality of the cell strings, the plurality of the drain selection lines, and the plurality of the word lines.

In an embodiment, in the program, the peripheral circuit may float bit lines of the plurality of the cell strings, the plurality of the drain selection lines, and the plurality of the word lines.

In an embodiment, in the program, the peripheral circuit may bias bit lines of the plurality of the cell strings to a reference voltage, and apply turn-on voltages to the plurality of the drain selection lines and the plurality of the word lines.

In an embodiment, each of the plurality of the cell strings may include a pipe gate, the pipe gate may be connected between first memory cells of the plurality of the memory cells and second memory cells of the plurality of the memory cells, and in the program, the peripheral circuit may bias a pipe line connected to the pipe gate to a reference voltage or float the pipe line connected to the pipe gate.

In an embodiment, after the program, the peripheral circuit may verify whether threshold voltages of the source selection transistors connected to the selected source selection line is the same as or higher than a first verification voltage. The peripheral circuit may be configured to complete the program when threshold voltages of the source selection transistors connected to the selected source selection line are equal to or greater than the first verification voltage, and program again the source selection transistors connected to the selected source selection line using an increased program voltage when at least one of the source selection transistors connected to the selected source selection line has a threshold voltage less than the first verification voltage.

In an embodiment, after the program, the peripheral circuit may verify whether at least one threshold voltage of the source selection transistors connected to the selected source selection line is equal to or greater than a second verification voltage. The peripheral circuit may be configured to complete the program when at least one threshold voltage among the source selection transistors connected to the selected source selection line is equal to or greater than the second verification voltage, and program again the source selection transistors connected to the selected source selection line using an increased program voltage when threshold voltages of the source selection transistors connected to the selected source selection line are less than the second verification voltage.

In an embodiment, first cell strings of the plurality of the cell strings may be connected to first bit lines, second cell strings of the plurality of the cell strings may be connected to second bit lines. After the program, the peripheral circuit may perform a first verification on source selection transistors of the first cell strings among source selection transistors connected to the selected source selection line through the first bit lines, and the peripheral circuit may perform a second verification on source selection transistors of the second cell strings among source selection transistors connected to the selected source selection line through the second bit lines.

In an embodiment, when the first verification and the second verification are passed, the peripheral circuit may complete the program.

In an embodiment, when at least one of the first verification and the second verification is failed, the peripheral circuit may apply an increased program voltage to the selected source selection lines, and thus program again the source selection transistors connected to the selected source selection line.

In an embodiment, a method of operating a semiconductor memory device including a plurality of cell strings, each of the cell strings including at least one source selection transistor connected to a common source line and a plurality of memory cells connected to the at least one source selection transistor. The method may include applying a reference voltage to the common source line, and applying a program voltage to a selected source selection line among at least one source selection line connected to source selection transistors of the plurality of the cell strings, and performing a program on source selection transistors connected to the selected source selection line.

In an embodiment, a semiconductor memory device may include a 3-dimensional memory cell array structure. The semiconductor memory device may include a cell string including at least one source selection transistor connected to a common source line, and a plurality of memory cells connected to the common source line through the at least one source selection transistor, a source selection line connected to a gate of the at least one source selection transistor, and a peripheral circuit connected to the common source line and the source selection line. The peripheral circuit may be configured to perform a program on the at least one source selection transistor by applying a program voltage to the source selection line, and by applying a reference voltage to the common source line.

BRIEF DESCRIPTION OF THE DRAWINGS

FIG. 7 is a circuit diagram illustrating a representation of one of the cell strings connected to a selected source selection line according to an embodiment.

FIG. 8 is a circuit diagram illustrating a representation of one of cell strings connected to a non-selected source selection line according to an embodiment.

FIG. 9 is a table illustrating voltages applied in operation S120 illustrated in FIG. 5 according to an embodiment.

FIG. 10 is a table illustrating voltages applied in operation S120 illustrated in FIG. 5 according to an embodiment.

DETAILED DESCRIPTION

Hereinafter, various examples of the embodiments will be described in detail with reference to the accompanying drawings. In the following description and the appended drawings, detailed descriptions of well-known functions or constructions will be omitted if they obscure the invention with unnecessary detail. Also, the embodiments may be embodied in different forms and should not be construed as limited to the embodiments set forth herein.

Throughout this specification, it will be understood that when a portion is "connected to" another portion, the portion may be "directly connected to" another portion, or the portion may be "indirectly connected to" another portion with an intervening element between the portions. Throughout this specification, it will be understood that when a portion "includes" another portion, without any contrary statement, the portion should not exclude another element, but may include another element.

Various embodiments may be directed to a semiconductor memory device including an increased reliability, and a method of operating the same.

Figure 1:
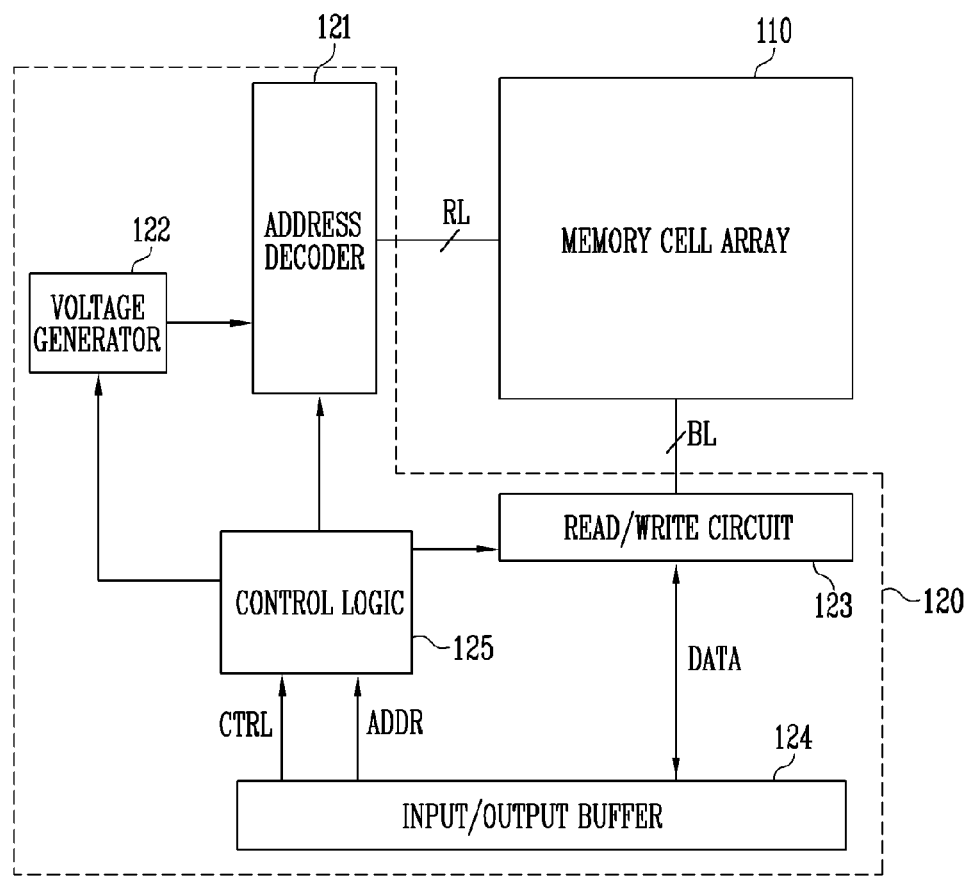
FIG. 1 is a block diagram illustrating a representation of a semiconductor memory device according to an embodiment.

FIG. 1 is a block diagram illustrating a representation of a semiconductor memory device 100 according to an embodiment.

Referring to FIG. 1, the semiconductor memory device 100 may include a memory cell array 110 and a peripheral circuit 120.

The memory cell array 110 is connected to an address decoder 121 through row lines RL. The memory cell array 110 is connected to a read/write circuit 123 through bit lines BL.

The memory cell array 110 may include a plurality of memory blocks. Each of the plurality of memory blocks may include a plurality of cell strings. Each of the plurality of the cell strings may include a plurality of memory cells. The memory cells may be stacked over a substrate. In an embodiment, the plurality of memory cells are nonvolatile memory cells. In an embodiment, each of the plurality of memory cells may be defined as a single level cell or a multi level cell. The memory cell array 110 may be explained below with reference to FIGS. 2 to 4.

The peripheral circuit 120 may include the address decoder 121, a voltage generator 122, the read/write circuit 123, an input/output buffer 124, and a control logic 125.

The address decoder 121 operates in response to a control of the control logic 125. The address decoder 121 is connected to the memory cell array 110 through the row lines RL. The address decoder 121 is configured to control the row lines RL. Here, the row lines RL include drain selection lines, word lines, source selection lines, and a common source line. In an embodiment, the row lines RL may further include a pipe line.

The address decoder 121 receives an address ADDR from the control logic 125.

In a program operation and a read operation, the address ADDR may include a block address and a column address. The address decoder 121 is configured to decode the block address among received addresses ADDR. The address decoder 121 selects one memory block based on the decoded block address. The address decoder 121 is configured to decode a row address among the received addresses ADDR. The address decoder 121 selects one of the drain selection lines of the selected memory block based on the decoded row address, and selects one among the plurality of the word lines of the selected memory block. Thus, memory cells corresponding to one page are selected.

In an embodiment, in an erase operation, the address ADDR includes the block address. The address decoder 121 decodes the block address, and selects one memory block based on the decoded block address.

According to the embodiments, the semiconductor memory device 100 programs source selection transistors in the memory cell array 110. Thus, threshold voltages of the source selection transistors are ranged within a desired voltage range. A program on the source selection transistors may be performed before a program on the memory cells of each page. In the program on the source selection transistors, the address decoder 121 may provide a program voltage to the selected source selection line in response to the control of the control logic 125. Here, the address decoder 121 may bias the common source line to a reference voltage (for example, a ground voltage).

In an embodiment, the address decoder 121 may include, for example, a block decoder, a row decoder, and an address buffer, and/or the like.

The voltage generator 122 operates in response to the control of the control logic 125. The voltage generator 122 generates an internal power voltage using an outside power voltage to be supplied to the semiconductor memory device 100. For example, the voltage generator 122 regulates the outside power voltage, and thus generates the internal power voltage. The internal power voltage generated by the voltage generator 122 is supplied to the address decoder 121, the read/write circuit 123, the input/output buffer 124, and the control logic 125. The internal power voltage generated by the voltage generator 122 is used as an operation voltage of the semiconductor memory device 100.

The voltage generator 122 generates a plurality of voltages using at least one of the outside power voltage and the inside power voltage. In an embodiment, the voltage generator 122 includes a plurality of pumping capacitors. The pumping capacitors receive the internal power voltage. The voltage generator 122 selectively activates the plurality of the pumping capacitors in response to the control of the control logic 125, thereby generating the plurality of the voltages. For example, the voltage generator 122 may generate various voltages to be applied to the row lines, and supply the generated voltages to the address decoder 121.

The read/write circuit 123 is connected to the memory cell array 110 through the bit lines BL. The read/write circuit 123 is configured to control the bit lines BL. The read/write circuit 123 may be configured to control the bit lines BL in response to the control of the control logic 125.

In the erase operation, the read/write circuit 123 may float the bit lines BL. In the program operation, the read/write circuit 123 transmits data DATA to be programmed, which is from the input/output buffer 124, to the bit lines BL. The memory cells selected based on the transmitted data DATA, are programmed. In the read operation, the read/write circuit 123 reads the data DATA from the memory cells selected through the bit lines BL, through the bit lines BL, and outputs the read data DATA to the input/output buffer 124.

In an embodiment, the read/write circuit 123 may include page buffers (or page registers), column selection circuits, and/or the like.

The control logic 125 is connected to the address decoder 121, the voltage generator 122, the read/write circuit 123, and the input/output buffer 124. The control logic 125 receives a control signal CTRL and the address ADDR from input/output buffer 124. The control logic 125 is configured to control overall operations of the semiconductor memory device 100 in response to the control signal CTRL. The control logic 125 transmits the address ADDR to the address decoder 121.

The input/output buffer 124 receives the control signal CTRL and the address ADDR from outside the semiconductor memory device 100, and transmits the received control signal CTRL and the address ADDR to the control logic 125. Also, the input/output buffer 124 is configured to transmit the data DATA input from the outside to the read/write circuit 123, or output the data DATA received from the read/write circuit 123 to the outside.

In an embodiment, the semiconductor memory device 100 may be a flash memory device.

According to the various examples of embodiments, the semiconductor memory device 100 programs the source selection transistors in the memory cell array 110. Since the program operation for the source selection transistors is performed, the threshold voltages of the source selection transistors correspond to the desired voltage range. In subsequently performed program operation or read operation for the memory cells, the source selection transistors may be controlled as desired. Thus, reliability of the semiconductor memory device 100 may be improved.

Figure 2:
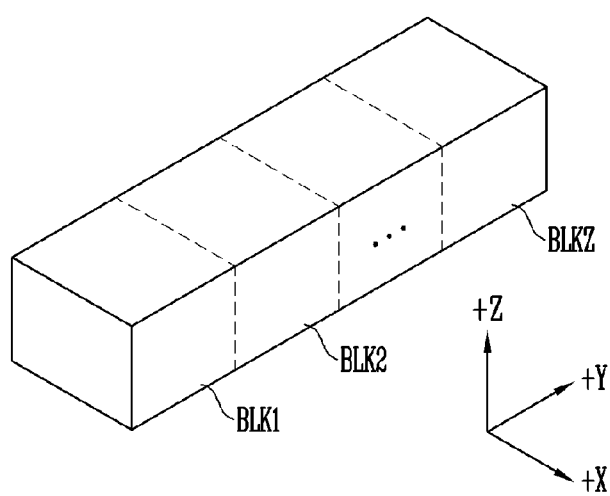
FIG. 2 is a block diagram illustrating a representation of an embodiment of a memory cell array illustrated in FIG. 1.

FIG. 2 is a block diagram illustrating a representation of an embodiment of the memory cell array 110 illustrated in FIG. 1.

Referring to FIG. 2, the memory cell array 110 may include a plurality of memory blocks BLK1 to BLKz. Each of the memory blocks BLK1 to BLKz has a 3-dimensional structure. Each of the memory blocks includes a plurality of memory cells stacked over a substrate. The plurality of the memory cells are arranged in +X direction, +Y direction, and +Z direction. A structure of each memory block will be explained below with reference to FIGS. 3 and 4.

Figure 3:
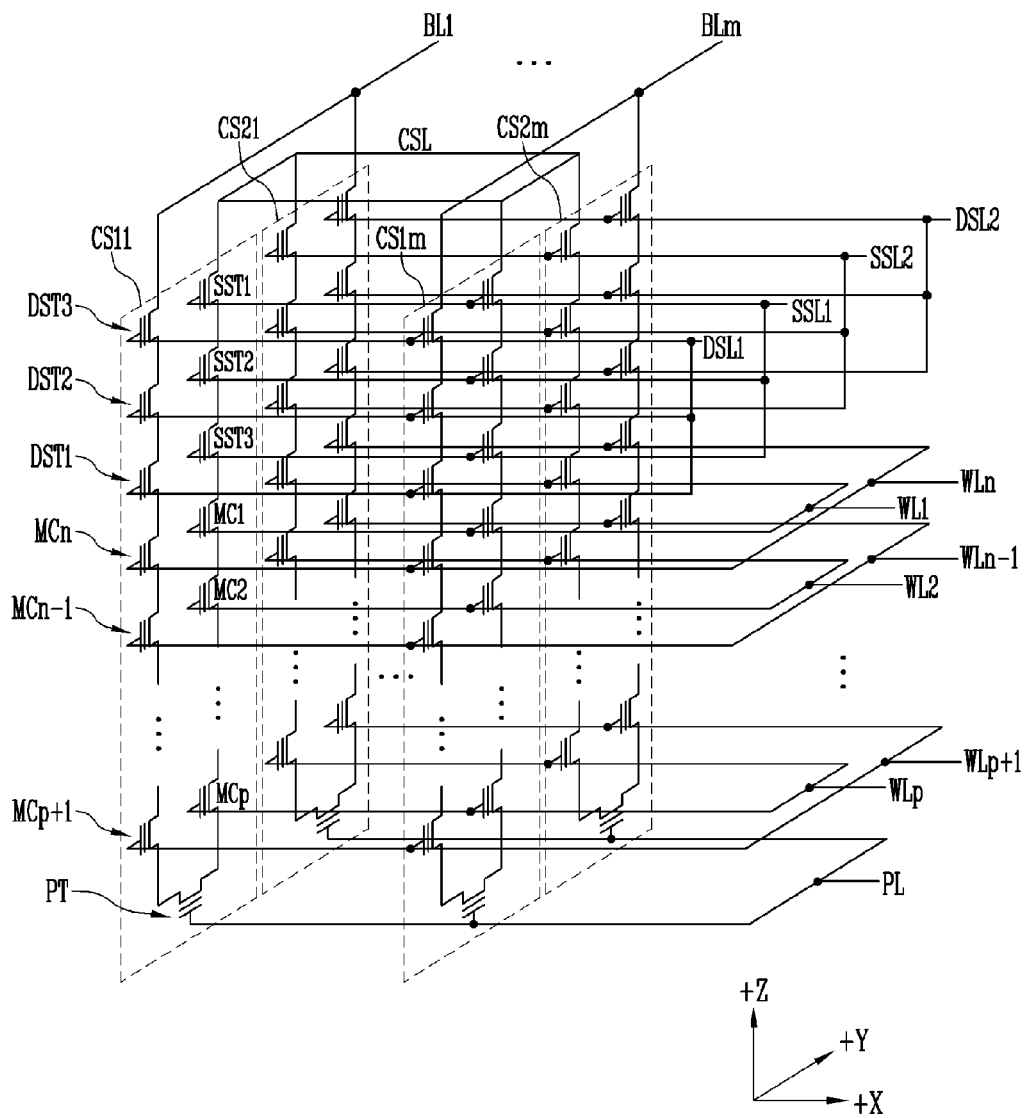
FIG. 3 is a circuit diagram illustrating a representation of one of memory blocks illustrated in FIG. 2.

FIG. 3 is a circuit diagram illustrating a representation of one (BLK1) of the memory blocks BLK1 to BLKz illustrated in FIG. 2.

Referring to FIG. 3, the first memory block BLK1 may include a plurality of cell strings CS11 to CS1m, CS21 to CS2m. Each of the plurality of the cell strings CS11 to CS1m, CS21 to CS2m may have a 'U' shape. In the first memory block BLK1, m cell strings are arranged in a row direction (that is, the +X direction). In FIG. 3, two cell strings are arranged in a column direction. However, it is only for convenience of explanation, and it will be understood that two or more cell strings may be arranged in the column direction (that is, the +Y direction).

Each of the plurality of the cell strings CS11 to CS1m, CS21 to CS2m may include at least one of source selection transistors SST1 to SST3, first to n-th memory cells MC1 to MCn, a pipe transistor PT, and at least one of drain selection transistors DST1 to DST3.

Each of the source selection transistors SST1 to SST3, DST1 to DST3 and the memory cells MC1 to MCn may have a similar structure. In an embodiment, each of the source selection transistors SST1 to SST3, DST1 to DST3 and the memory cells MC1 to MCn may include a channel layer, a tunneling insulating layer, a charge storage layer, and a blocking insulating layer. Thus, each of the source selection transistors SST1 to SST3, DST1 to DST3 and the memory cells MC1 to MCn has a threshold voltage that varies based on the number of electrons trapped in the charge storage layer thereof.

Referring to FIG. 3, three source selection transistors SST1 to SST3 are provided to each cell string. The first to third source selection transistors SST1 to SST3 of each cell string are connected in series between a common source line CSL and memory cells MC1 to MCp. Sources of first source selection transistors SST1 of the cell strings CS11 to CS1m, CS21 to CS2m are commonly connected to the common source line CSL.

In an embodiment, source selection transistors SST1 to SST3 of the cell strings arranged in the same row direction (+X direction) are connected to the source selection line. The source selection line may extend in the row direction. Source selection transistors SST1 to SST3 of cell strings CS11 to CS1m of a first row are connected to a first source selection line SSL1. Source selection transistors SST1 to SST3 of cell strings CS21 to CS2m of a second row are connected to a second source selection line SSL2.

In an embodiment, source selection transistors SST1 to SST3 of cell strings arranged in different rows may be connected to one source selection line. For example, the first and second source selection lines SSL1 and SSL2 illustrated in FIG. 3 may be connected to each other so as to be provided as one line. In this examples, the source selection transistors SST1 to SST3 of the cell strings CS11 to CS1m, CS21 to CS2m of the first and second rows may be controlled by one source selection line.

The first to n-th memory cells MC1 to MCn of each cell string may be connected between the source selection transistors SST1 to SST3 and the drain selection transistors DST1 to DST3. The first to n-th memory cells MC1 to MCn may be classified into the first to p-th memory cells MC1 to MCp and (p+1)-th to n-th memory cells MCp+1 to MCn. The first to p-th memory cells MC1 to MCp and the (p+1)-th to n-th memory cells MCp+1 to MCn are connected to each other through the pipe transistor PT.

The first to p-th memory cells MC1 to MCp are sequentially arranged in an opposite direction to the +Z direction. The first to p-th memory cells MC1 to MCp may be connected in series between the source selection transistors SST1 to SST3 and the pipe transistor PT. The (p+1)-th to n-th memory cells MCp+1 to MCn are sequentially arranged in the +Z direction. The (p+1)-th to n-th memory cells MCp+1 to MCn may be connected in series between the pipe transistor PT and the drain selection transistors DST1 to DST3. Gates of the first to n-th memory cells MC1 to MCn may be connected to first to n-th word lines WL1 to WLn, respectively.

A pipe transistor PT of each cell string is connected between the first to p-th memory cells MC1 to MCp and the (p+1)-th to n-th memory cells MCp+1 to MCn. A gate of the pipe transistor PT of each cell string may be connected to a pipe line PL.

Referring to FIG. 3, three drain selection transistors DST1 to DST3 provided to each cell string are used as an example. The first to third drain selection transistors DST1 to DST3 of each cell string are connected in series between a corresponding bit line and the memory cells MCp+1 to MCn. A drain of the third drain selection transistor DST3 is connected to the corresponding bit line.

Drain selection transistors DST1 to DST3 of cell strings arranged in the same row direction (the +X direction) are connected to the drain selection line extending in the row direction. The first row and the second row are defined by first and second drain selection lines DSL1 and DSL2, respectively. Drain selection transistors DST1 to DST3 of cell strings CS11 to CS1m of the first row are connected to the first drain selection line DSL1. Drain selection transistors DST1 to DST3 of cell strings CS21 to CS2m of the second row are connected to the second drain selection line DSL2.

In an embodiment, the first to third drain selection transistors DST1 to DST3 of each cell string may be connected to one drain selection line as shown in FIG. 3. Different from as described in FIG. 3, the first to third drain selection transistors DST1 to DST3 of each cell string may be connected to different drain selection lines.

Cell strings arranged in the column direction (the +Y direction) are connected to the bit line extending in the column direction. For example, cell strings CS11 and CS21 of a first column are connected to a first bit line BL1. Cell strings CS1m and CS2m of an m-th column are connected to a m-th bit line BLm.

In each cell string, the memory cells MC1 to MCp and the source selection transistors SST1 to SST3 are sequentially stacked in a direction, namely, the +Z direction, in which the memory cells MC1 to MCp and the source selection transistors SST1 to SST3 stack above a substrate (not illustrated) disposed under the memory block BLK1. In each cell string, the memory cells MCp+1 to MCn and the drain selection transistors DST1 to DST3 are sequentially stacked in the +Z direction.

The semiconductor memory device 100 (illustrated in FIG. 1) controls the source selection transistors SST1 to SST3, and thus electrically connects or electrically disconnects the memory cells MC1 to MCn and the common source line CSL. When the threshold voltages of the source selection transistors SST1 to SST3 outrange a desired voltage distribution, the source selection transistors SST1 to SST3 may not be effectively controlled.

The source selection transistors SST1 to SST3 are assumed to have threshold voltages greater than the desired voltage distribution. When the source selection transistors SST1 to SST3 are turned on and an arbitrary operation is performed, a current, which flows through the source selection transistors SST1 to SST3 to the common source line CSL, may be unintentionally decreased. That is, an amount of the current flowing through the cell string to the common source line CSL may be decreased.

The source selection transistors SST1 to SST3 are assumed to have threshold voltages less than the desired voltage distribution. When the source selection transistors SST1 to SST3 are turned off and an arbitrary operation is performed, the current may unintentionally leak through the source selection transistors SST1 to SST3 to the common source line CSL.

Thus, effectively setting the threshold voltages of the source selection transistors SST1 to SST3 may be an important factor in improvement of reliability of the semiconductor memory device 100.

Figure 4:
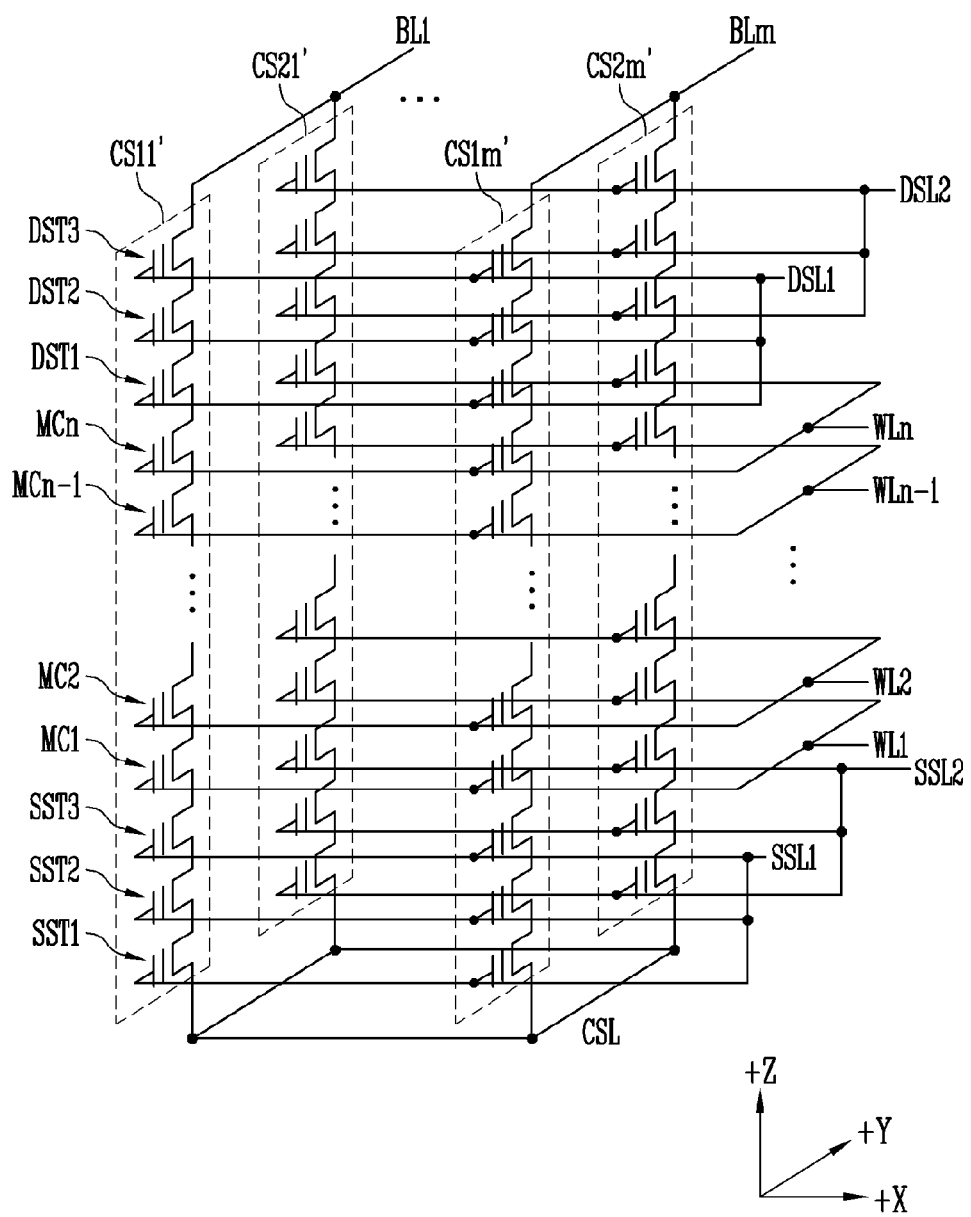
FIG. 4 is a circuit diagram illustrating a representation of one of memory blocks, illustrated in FIG. 2, according to an embodiment.

FIG. 4 is a circuit diagram illustrating a representation of one (BLK1) of the memory blocks BLK1 to BLKz illustrated in FIG. 2 according to an embodiment (BLK1').

Referring to FIG. 4, the first memory block BLK1' may include a plurality of cell strings CS11' to CS1m', CS21' to CS2m'. The plurality of the cell strings CS11' to CS1m', CS21' to CS2m' extend in +Z direction. Each of the plurality of the cell strings CS11' to CS1m', CS21' to CS2m' may include at least one of source selection transistors SST1 to SST3, first to n-th memory cells MC1 to MCn, and at least one of drain selection transistors DST1 to DST3. The drain selection transistors DST1 to DST3 are stacked on a substrate (not illustrated) disposed under the first memory block BLK1'.

The first to third source selection transistors SST1 to SST3 of each cell string are connected in series between a common source line CSL and memory cells MC1 to MCn. A source of a first source selection transistor SST1 of each cell string is connected to the common source line CSL.

Source selection transistors SST1 to SST3 of the cell strings arranged in the same row direction (+X direction) are connected to the source selection line extending in the row direction. Source selection transistors SST1 to SST3 of cell strings CS11' to CS1m' of a first row are connected to a first source selection line SSL1. Source selection transistors SST1 to SST3 of cell strings CS21' to CS2m' of a second row are connected to a second source selection line SSL2.

The first to n-th memory cells MC1 to MCn of each cell string are connected in series between the source selection transistors SST1 to SST3 and the drain selection transistors DST1 to DST3. The first to n-th memory cells MC1 to MCn are connected to first to n-th word lines WL1 to WLn.

The first to third drain selection transistors DST1 to DST3 of each cell string are connected in series between a corresponding bit line and the memory cells MC1 to MCn. A drain of a third drain selection transistor DST3 is connected to the corresponding bit line.

Drain selection transistors DST1 to DST3 of cell strings arranged in the same row are connected to a drain selection line extending in the row direction. Drain selection transistors DST1 to DST3 of cell strings CS11' to CS1m' of a first row are connected to a first drain selection line DSL1. Drain selection transistors DST1 to DST3 of cell strings CS21' to CS2m' of a second row are connected to a second drain selection line DSL2.

As a result, the memory block BLK1' illustrated in FIG. 4 has an equivalent circuit similar to the memory block BLK1 illustrated in FIG. 3 except omission of the pipe transistor PT in each cell string.

Hereinafter, for convenience of explanation, an example will be explained based on the memory block BLK1 of FIG. 3.

Figures 5, 6:
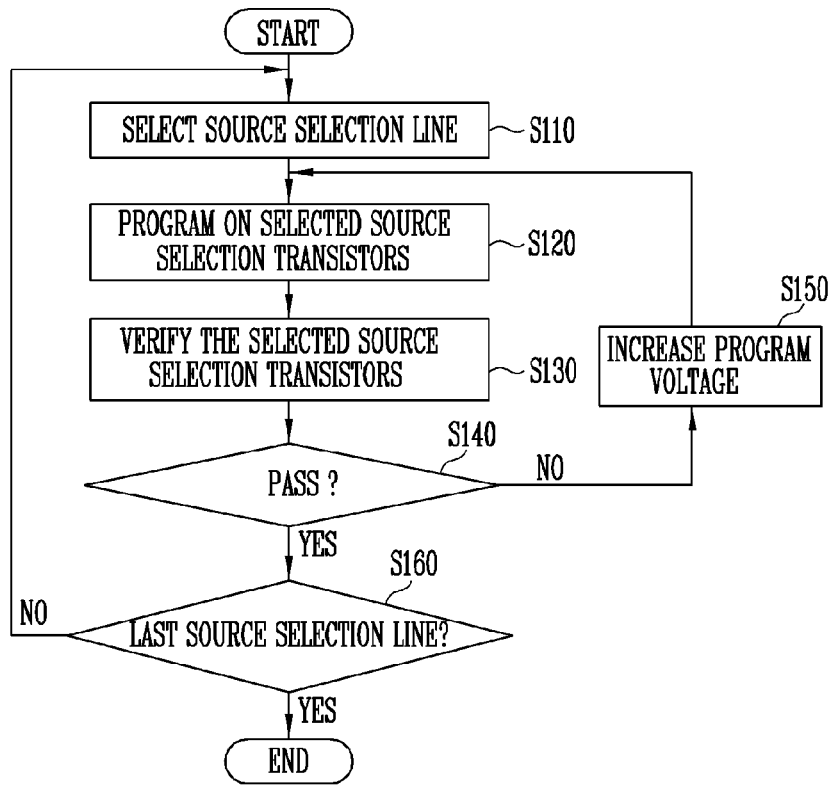
FIG. 5 is a flowchart illustrating a representation of a program operation of source selection transistors of one memory block according to an embodiment.
FIG. 6 is a table illustrating voltages applied in an operation S120 illustrated in FIG. 5 according to an embodiment.

FIG. 5 is a flowchart illustrating a representation of a program operation of source selection transistors SST1 to SST3 of one memory block BLK1 according to an embodiment.

Referring to FIGS. 1, 3, and 5, in Operation S110, one source selection line is selected among source selection lines SSL1 and SSL2. Hereinafter, a first source selection line SSL1 is assumed to be selected.

In Operation S120, a program on source selection transistors SST1 to SST3 (hereinafter, referred to as selected source selection transistors) connected to a selected source selection line SSL1, is performed. The selected source selection line SSL1 is biased with a program voltage. A common source line CSL is biased with a reference voltage. For example, a voltage generator 122 generates a program voltage of a high voltage in response to a control of a control logic 125. An address decoder 121 applies the program voltage from the voltage generator 122 to the selected source selection line SSL1, and applies the reference voltage to the common source line CSL, in response to the control of the control logic 125.

By the program voltage applied to the selected source selection line SSL1, the selected source selection transistors SST1 to SST3 are turned on, and the reference voltage of the common source line CSL is applied to channels thereof. Threshold voltages of the selected source selection transistors SST1 to SST3 are increased by a difference between the voltage of the common source line CSL and the program voltage.

The selected source selection transistors SST1 to SST3 are directly connected to the common source line CSL. Regardless of voltages applied to bit lines BL1 to BLm, when the program voltage is applied to the selected source selection line SSL1, the channels of the selected source selection transistors SST1 to SST3 receive the voltage of the common source line CSL. Thus, the program on the source selection transistors SST1 to SST3 is not controlled by a bit line unit.

Through implementing the program, the threshold voltages of the selected source selection transistors SST1 to SST3 may be increased.

In Operation 130, a verification corresponding to the selected source selection transistors SST1 to SST3 is performed. By the verification, the threshold voltages of the selected source selection transistors SST1 to SST3 are determined.

In an embodiment, it may be determined whether the threshold voltages of the selected source selection transistors SST1 to SST3 are greater than a predetermined verification voltage. A read/write circuit 123 supplies a predetermined voltage or current to the bit lines BL1 to BLm, and the address decoder 121 applies a verification voltage Vvrf (illustrated in FIG. 11) to the selected source selection line SSL1. The address decoder 121 controls row lines DSL1, WL1 to WLn, and PL, and turns on drain selection transistors DST1 to DST3 of cell strings CS11 to CS1m of a first row, memory cells MC1 to MCn, and pipe transistors PT.

A decrease in the voltage or current supplied to a bit line, may mean that threshold voltages of source selection transistors SST1 to SST3 of a corresponding cell string are less than a verification voltage. Maintenance of voltage or current supplied to the bit line, may mean one of the threshold voltages of the source selection transistors SST1 to SST3 of the corresponding cell string is greater than a desired voltage. The read/write circuit 123 detects the source selection transistors SST1 to SST3 of each cell string by the bit line unit, and transmits results of the detection to the control logic 125.

The fact that the threshold voltages of the selected source selection transistors SST1 to SST3 are greater than the predetermined verification voltage may be defined as 'pass'. The fact that a predetermined number (for example, one) of the selected source selection transistors SST1 to SST3 has a threshold voltage lower than the predetermined verification voltage may be defined as 'fail'.

In Operation S140, when the verification result is fail, the control logic 125 performs Operation S150. When the verification result is pass, the control logic 125 performs Operation S160.

In Operation S150, the program voltage is increased. The control logic 125 sets the voltage generator 122 such that the voltage generator 122 generates the increased program voltage. Then, Operation S120 is performed again using the increased program voltage.

In Operation S160, when the selected source selection line SSL1 is a last source selection line, the program operation corresponding to source selection transistors SST1 to SST3 included in one memory block BLK1 is completed. When the selected source selection line SSL1 is not the last source selection line, Operation S110 is performed to select a next source selection line. Thus, the program operation may be performed in sequence on each of the first and second source selection lines SSL1 and SSL2.

FIG. 6 is a table illustrating voltages applied in an operation S120 illustrated in FIG. 5 according to an embodiment. FIG. 7 is a circuit diagram illustrating one (CS11) of cell strings CS11 to CS1m connected to a selected source selection line SSL1 according to an embodiment. FIG. 8 is a circuit diagram illustrating one (CS21) of cell strings CS21 to CS2m connected to a non-selected source selection line SSL2 according to an embodiment.

Referring to FIGS. 3 and 6, a reference voltage Vss (for example, a ground voltage) is applied to bit lines BL1 to BLm, drain selection lines DSL1 and DSL2, word lines WL1 to WLn, a pipe line PL, and a common source line CSL. Threshold voltages of drain selection transistors DST1 to DST3, memory cells MC1 to MCn, and pipe transistors PT included in a memory block BLK1, are maintained.

A program voltage Vpgm of a high voltage is applied to a selected source selection line SSL1. When the program voltage Vpgm is applied to the selected source selection line SSL1, channels are formed in source selection transistors SST1 to SST3 connected to the selected source selection line SSL1, and thus the selected source selection transistors SST1 to SST3 may be turned on. The reference voltage Vss of the common source line CSL may be applied to the channels ('a' illustrated in FIG. 7). Also, threshold voltages of the selected source selection transistors SST1 to SST3 may be increased by a difference between a program voltage Vpgm of the selected source selection line SSL1 and a reference voltage of corresponding channels.

The memory cells MC1 to MCn and the drain selection transistors DST1 to DST3 are turned off. Thus, a voltage of the common source line CSL is not transmitted to channels of the memory cells MC1 to MCn and channels of the drain selection transistors DST1 to DST3 ('b' illustrated in FIG. 7). Also, a voltage of the bit line BL1 is not transmitted to the channels of the drain selection transistors DST1 to DST3 and the channels of the memory cells MC1 to MCn ('c' illustrated in FIG. 7).

A program prohibition voltage Vpih is applied to a non-selected source selection line SSL2. The program prohibition voltage Vpih may be a low voltage. For example, the program prohibition voltage Vpih may be a reference voltage. In an embodiment, the program prohibition voltage Vpih may be set not to turn on source selection transistors SST1 to SST3 (hereinafter, referred to as non-selected source selection transistors) connected to the non-selected source selection line SSL2. Thus, a voltage of the common source line CSL is not transmitted to the non-selected source selection transistors SST1 to SST3 ('d' illustrated in FIG. 8). Also, since the program prohibition voltage Vpih is the low voltage, threshold voltages of the non-selected source selection transistors SST1 to SST3 are not increased.

Since the memory cells MC1 to MCn and the drain selection transistors DST1 to DST3 are turned off, the voltage of the bit line BL1 is not transmitted to the channels of the drain selection transistors DST1 to DST3 and the channels of the memory cells MC1 to MCn ('e' illustrated in FIG. 8).

In an embodiment, the program prohibition voltage Vpih may be set so as to turn on the non-selected source selection transistors SST1 to SST3. In these examples, the reference voltage Vss of the common source line CSL may be applied to the channels of the non-selected source selection transistors SST1 to SST3. However, The program prohibition voltage Vpih may be set such that a difference between the program prohibition voltage Vpih and the reference voltage Vss of the common source line CSL is relatively low, thereby not increasing the threshold voltages of the non-selected source selection transistors SST1 to SST3.

According to an embodiment, while in the program, the channels of the selected source selection transistors SST1 to SST3 receive the voltage from the common source line CSL directly connected thereto. The selected source selection transistors SST1 to SST3 are programmed by the difference between the program voltage Vpgm of the selected source selection line SSL1 and the voltage from the common source line CSL. Since the predetermined turn-on voltages are applied to the drain selection line DSL1 and the word lines WL1 to WLn, the selected source selection transistors SST1 to SST3 may be programmed even if the drain selection transistors DST1 to DST3 and the memory cells MC1 to MCn are not turned on. Therefore, according to an embodiment, while in the program on the selected source selection transistors SST1 to SST3, a disturbance generated by application of high voltages to the memory cells MC1 to MCn and the drain selection transistors DST1 to DST3 may be decreased.

FIG. 9 is a table illustrating voltages applied in operation S120 illustrated in FIG. 5 according to an embodiment.

Referring to FIGS. 3 and 9, bit lines BL1 to BLm, drain selection lines DSL1 and DSL2, word lines WL1 to WLn, and a pipe line PL are floated. A voltage of each of the bit lines BL1 to BLm, the drain selection lines DSL1 and DSL2, the word lines WL1 to WLn, and the pipe line PL may be increased by a coupling effect with a program voltage Vpgm of selected source selection lines SSL1. Thus, an electric field between the bit lines BL1 to BLm, the drain selection lines DSL1 and DSL2, the word lines WL1 to WLn, and the pipe line PL with respect to the selected source selection line SSL1 may be softened. Also, a power used to bias the bit lines BL1 to BLm, the drain selection lines DSL1 and DSL2, the word lines WL1 to WLn, and the pipe line PL may not be consumed.

A program voltage Vpgm of a high voltage is applied to the selected source selection line SSL1. A reference voltage Vss is applied to the common source line CSL. Threshold voltages of the selected source selection transistors SST1 to SST3 may be increased.

In an embodiment, a non-selected source selection line SSL2 may be floated. A voltage of the non-selected source selection line SSL2 may be increased according to the a program voltage Vpgm of the selected source selection lines SSL1. Thus, an electric field between the non-selected source selection line SSL2 and the selected source selection lines SSL1 may be softened.

Channels of non-selected source selection transistors SST1 to SSL3 may also be increased by the program voltage Vpgm of the selected source selection lines SSL1. Thus, a difference between an increased voltage of the non-selected source selection line SSL2 and increased voltages of the non-selected source selection transistors SST1 to SST3 may be low. As a result, threshold voltages of the non-selected source selection transistors SST1 to SST3 may not be increased.

FIG. 10 is a table illustrating voltages applied in operation S120 illustrated in FIG. 5 according to an embodiment.

Referring to FIGS. 3 and 10, a reference voltage Vss is applied to bit lines BL1 to BLm. First and second turn-on voltages Vtrn1 and Vtrn2 are applied to word lines WL1 to WLn and a pipe line PL. The first and second turn-on voltages are voltages to turn on drain selection transistors DST1 to DST3 connected to a selected drain selection line DSL1, corresponding memory cells MC1 to MCn, and corresponding pipe transistors PT. The second turn-on voltage Vtrn2 may be higher than the first turn-on voltage Vtrn1. The first and second turn-on voltages Vtrn1 and Vtrn2 are lower than a program voltage Vpgm. Thus, a reference voltage Vss of the bit lines BL1 to BLm may be transmitted to channels of selected source selection transistors SST1 to SST3.

A turn-off voltage Vtrf may be applied to a non-selected drain selection line DSL2. The turn-off voltage Vtrf may be a voltage to turn off drain selection transistors DST1 to DST3 connected to the non-selected drain selection line DSL2. Thus, the reference voltage Vss of the bit lines BL1 to BLm is not transmitted to the non-selected source selection transistors SST1 to SST3.

When an embodiment is applied to the memory block BLK1' illustrated in FIG. 4, the first and second turn-on voltages Vtrn1 and Vtrn2 applied to the selected drain selection line DSL1, the word lines WL1 to WLn, and the pipe line PL are increased as the corresponding line is closer to a selected source selection line SSL1. Thus, an electric field between the selected drain selection line DSL1, the word lines WL1 to WLn, and the pipe line PL with respect to the selected source selection line SSL1 may be softened.

A program voltage Vpgm of a high voltage is applied to the selected source selection line SSL1. The reference voltage Vss is applied to a common source line CSL. Channels of source selection transistors SST1 to SST3 connected to the selected source selection line SSL1 receive the reference voltage Vss from the bit lines BL1 to BLm and the common source line CSL. Threshold voltages of the selected source selection transistors SST1 to SST3 based on a difference between the program voltage Vpgm and the reference voltage Vss may be increased.

A program prohibition voltage Vpih is applied to a non-selected source selection line SSL2. Since the program prohibition voltage Vpih is a low voltage, threshold voltages of the non-selected source selection transistors SST1 to SST3 are not increased.

Figure 11:
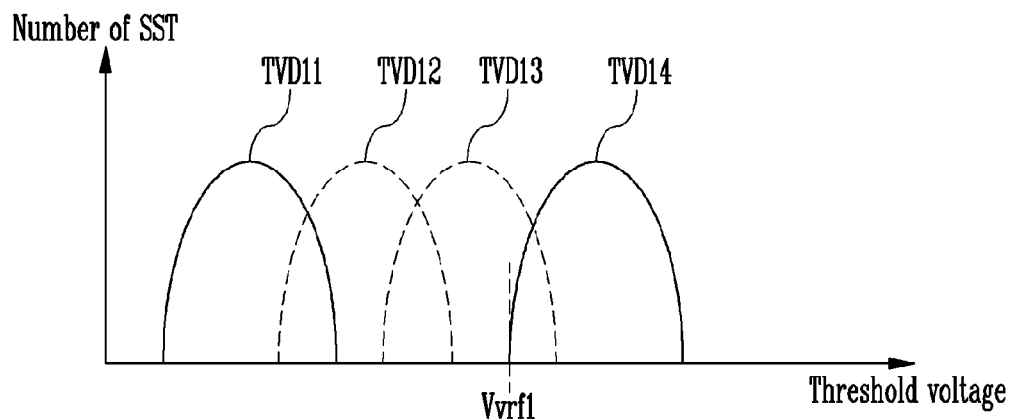
FIG. 11 is a view illustrating a distribution of a threshold voltage of selected source selection transistors in a program operation of selected source selection transistors according to an embodiment.
Figure 12:
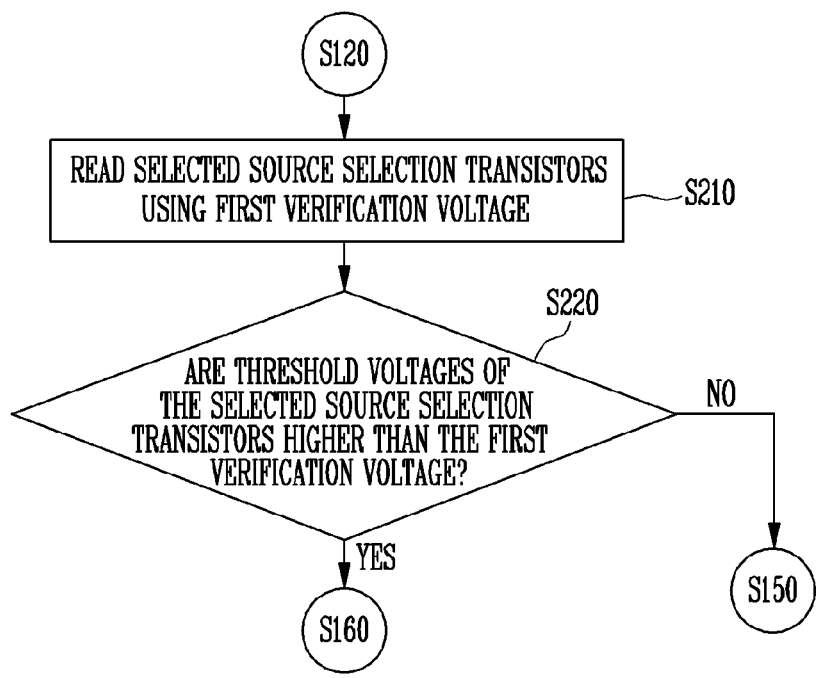
FIG. 12 is a view illustrating operations S130 and S140 illustrated in FIG. 5 according to an embodiment.

FIG. 11 is a view illustrating a distribution of a threshold voltage of selected source selection transistors SST1 to SST3 in a program operation of the selected source selection transistors SST1 to SST3 according to an embodiment. FIG. 12 is a view illustrating Operations S130 and S140 illustrated in FIG. 5 according to an embodiment.

Referring to FIGS. 3 and 11, before a program operation, selected source selection transistors SST1 to SST3 have a first threshold voltage state TVD11. Then, when the program is performed on the selected source selection transistors SST1 to SST3, threshold voltages of the selected source selection transistors SST1 to SST3 are increased to reach a second threshold voltage state TVD12.

In an embodiment, in verification on the selected source selection transistors SST1 to SST3, it may be determined whether the threshold voltages of the selected source selection transistors SST1 to SST3 are greater than a first verification voltage Vvrf1. Referring to FIG. 12, the selected source selection transistors SST1 to SST3 are read using the first verification voltage Vvrf1 (Operation S210). The first verification voltage Vvrf1 may be applied to the selected source selection line SSL1. A selected drain selection line DSL1, word lines WL1 to WLn, and a pipe line PL are controlled, and thus corresponding drain selection transistors DST1 to DST3, corresponding memory cells MC1 to MCn, and corresponding pipe transistors PT may be turned on. The selected source selection transistors SST1 to SST3 may be read through bit lines BL1 to BLm.

When the threshold voltages of the selected source selection transistors SST1 to SST3 are greater than the first verification voltage Vvrf1, Operation S160 may be performed (Operation S220). When at least one of the selected source selection transistors SST1 to SST3 has a lower voltage than the first verification voltage Vvrf1, Operation S150 may be performed (Operation S220). In FIG. 11, the second threshold voltage state TVD12 is less than the first verification voltage Vvrf1. Thus, Operation S150 is performed, and the selected source selection transistors SST1 to SST3 may be programmed again using the increased program voltage.

When the program on the selected source selection transistors SST1 to SST3 is repeated by the above-mentioned method, the threshold voltages of the selected source selection transistors SST1 to SST3 may reach a fourth threshold voltage state TVD14 through a third threshold voltage state TVD13.

A voltage range of the fourth threshold voltage state TVD14 is greater than the first verification voltage Vvrf1. For example, when the selected source selection transistors SST1 to SST3 are read through the bit lines BL1 to BLm by application of the first verification voltage Vvrf1 to the selected source selection line SSL1, the selected source selection transistors SST1 to SST3 may be determined as off-cells. The program operation on the selected source selection transistors SST1 to SST3 may be completed.

As a result, the selected source selection transistors SST1 to SST3 may have threshold voltages higher than the first verification voltage Vvrf1. In an embodiment, turn-off characteristics of the selected source selection transistors SST1 to SST3 may be effectively set.

Figure 13:
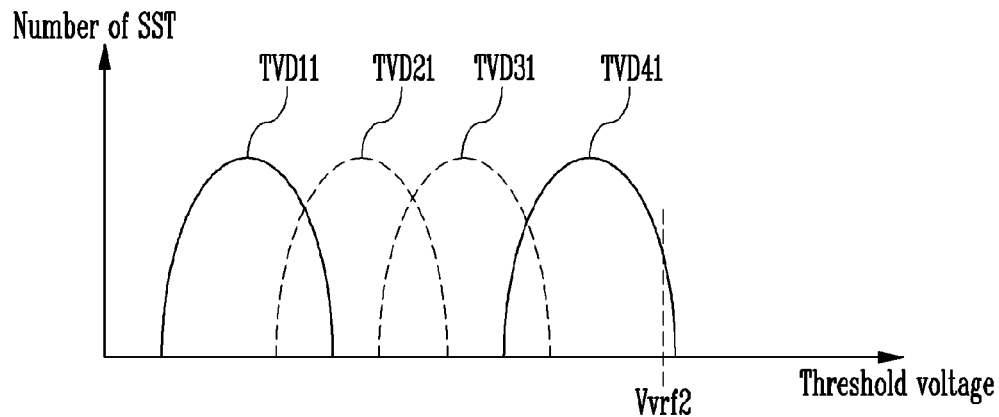
FIG. 13 is a view illustrating a distribution of a threshold voltage of selected source selection transistors in a program operation of selected source selection transistors according to an embodiment.
Figure 14:
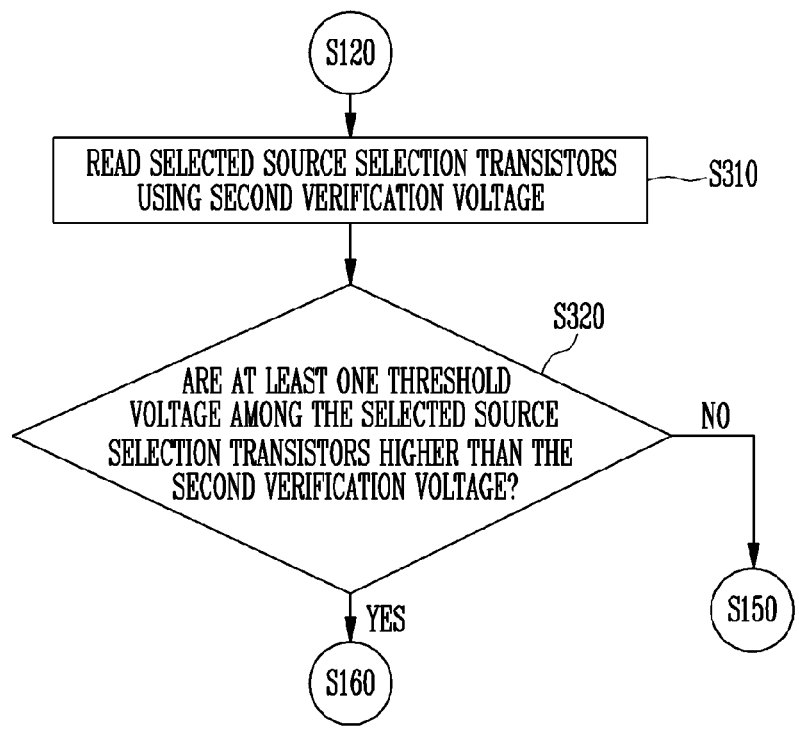
FIG. 14 is a view illustrating operations S130 and S140 illustrated in FIG. 5 according to an embodiment.

FIG. 13 is a view illustrating a distribution of a threshold voltage of selected source selection transistors SST1 to SST3 in a program operation of selected source selection transistors SST1 to SST3 according to an embodiment. FIG. 14 is a view illustrating Operations S130 and S140 illustrated in FIG. 5 according to an embodiment.

Referring to FIG. 13, before a program operation, selected source selection transistors SST1 to SST3 have a first threshold voltage state TVD11. Then, when the program is performed on the selected source selection transistors SST1 to SST3, threshold voltages of the selected source selection transistors SST1 to SST3 are increased to reach a fifth threshold voltage state TVD21.

In an embodiment, in verification on the selected source selection transistors SST1 to SST3, it may be determined whether at least one threshold voltage among the selected source selection transistors SST1 to SST3 is greater than a second verification voltage Vvrf2. Referring to FIG. 14, the selected source selection transistors SST1 to SST3 are read using the second verification voltage Vvrf2 (Operation S310). The second verification voltage Vvrf2 may be applied to the selected source selection line SSL1, and the selected source selection transistors SST1 to SST3 may be read through the bit lines BL1 to BLm.

When the threshold voltage of at least one of the selected source selection transistors SST1 to SST3 is greater than the second verification voltage Vvrf2, Operation S160 may be performed (Operation S320). When the threshold voltages of the selected source selection transistors SST1 to SST3 are lower than the second verification voltage Vvrf2, Operation S150 may be performed (Operation S320). In FIG. 13, the fifth threshold voltage state TVD21 is less than the second verification voltage Vvrf2. Thus, Operation S150 is performed, and the selected source selection transistors SST1 to SST3 may be programmed again using the increased program voltage.

When the program on the selected source selection transistors SST1 to SST3 is repeated by the above-mentioned method, the threshold voltages of the selected source selection transistors SST1 to SST3 may reach a seventh threshold voltage state TVD41 through a sixth threshold voltage state TVD31.

A highest voltage among a voltage range of the seventh threshold voltage state TVD41 is greater than the second verification voltage Vvrf2. That is, in the verification, the threshold voltage of at least one of the selected source selection transistors SST1 to SST3 is greater than the second verification voltage Vvrf2. The program operation on the selected source selection transistors SST1 to SST3 may be completed.

As a result, most of the selected source selection transistors SST1 to SST3 may have threshold voltages ranged between an arbitrary voltage and the second verification voltage Vvrf2. In an embodiment, the threshold voltages of the selected source selection transistors SST1 to SST3 may not be excessively increased. Characteristics of the selected source selection transistors SST1 to SST3 passing a current, may be effectively set.

Figure 15:
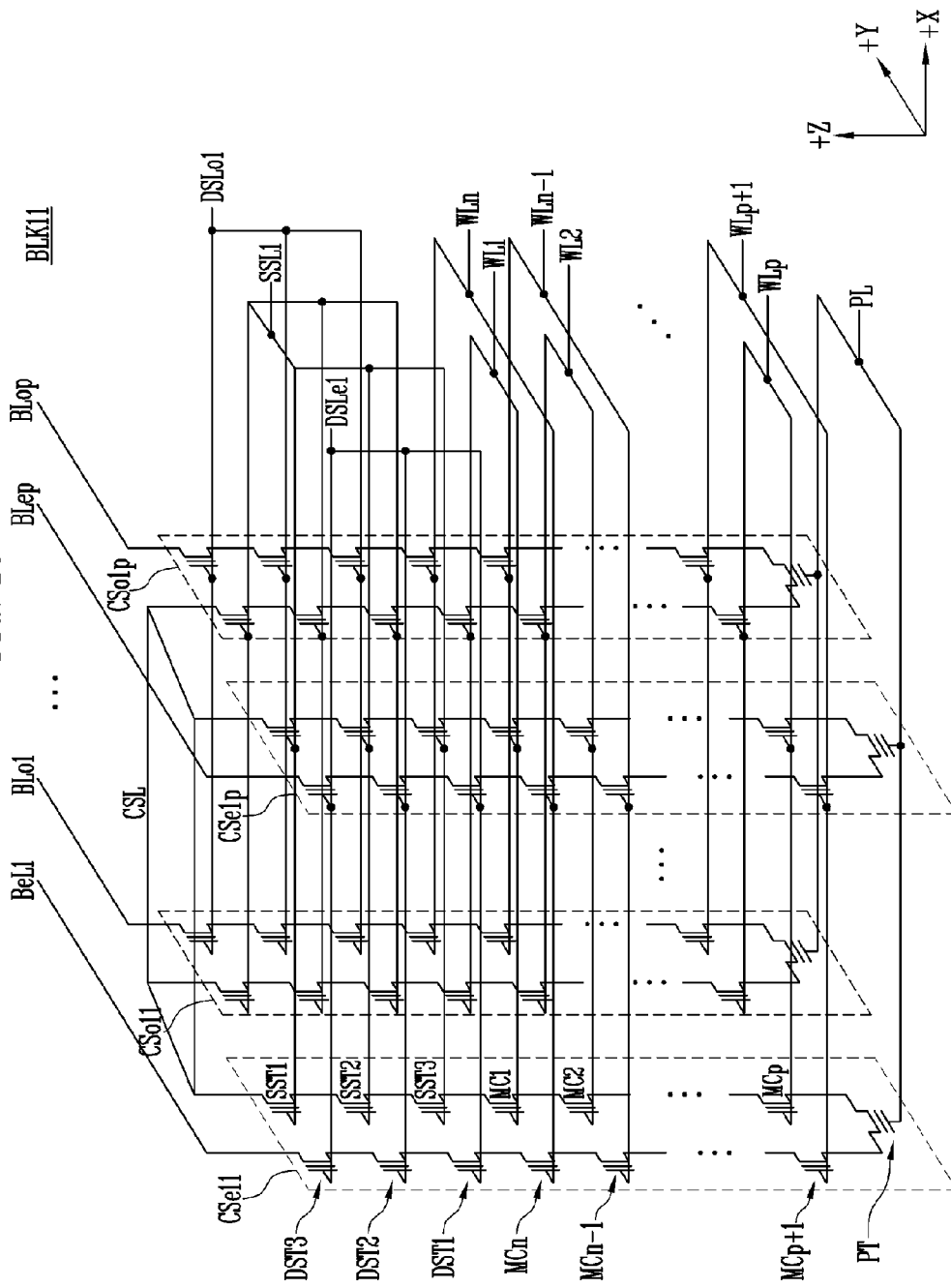
FIG. 15 is a circuit diagram illustrating a representation of one of the memory blocks illustrated in FIG. 2 according to an embodiment.

FIG. 15 is a circuit diagram illustrating a representation of one (BLK1) of the memory blocks BLK1 to BLKz illustrated in FIG. 2 according to an embodiment.

Referring to FIG. 15, the memory block BLK11 may include even cell strings CSe11 to CSe1$p$ and odd cell strings CSo11 to CSo1$p$.

Each of the even cell strings CSe11 to CSe1$p$ and the odd cell strings CSo11 to CSo1$p$ may include at least one of source selection transistors SST1 to SST3, first to n-th memory cells MC1 to MCn, a pipe transistor PT, and at least one of drain selection transistors DST1 to DST3.

It will be understood that the even cell strings CSe11 to CSe1$p$ and the odd cell strings CSo11 to CSo1$p$ illustrated in FIG. 15 are a modified embodiment of the cell strings CS11 to CS1$m$ of a first row illustrated in FIG. 3.

First to p-th even cell strings CSe11 to CSe1$p$ are connected to first to p-th even bit lines BLe1 to BLep, respectively. First to p-th odd cell strings CSo11 to CSo1$p$ are connected to first to p-th odd bit lines BLo1 to BLop, respectively. The even cell strings CSe11 to CSe1$p$ and the odd cell strings CSo11 to CSo1$p$ are commonly connected to a common source line CSL.

First to n-th memory cells MC1 to MCn of each cell string are connected to first to n-th word lines WL1 to WLn.

Drain selection transistors DST1 to DST3 of the first to p-th even cell strings CSe11 to CSe1$p$ are connected to a first even drain selection line DSLe1. Drain selection transistors DST1 to DST3 of the first to p-th odd cell strings CSo11 to CSo1$p$ are connected to a first odd drain selection line DSLo1.

Source selection transistors SST1 to SST3 of the even cell strings CSe11 to CSe1$p$ and the odd cell strings CSo11 to CSo1$p$ are connected to one source selection line SSL1.

As a result, the even cell strings and the odd cell strings are connected to different drain selection lines DSLe1 and DSLo1, and connected to the same source selection line SSL1.

When the even cell strings CSe11 to CSe1$p$ and the odd cell strings CSo11 to CSo1$p$ illustrated in FIG. 15 are defined to one cell string group, it will be understood that a different cell string group connected to the even bit lines BLe1 to BLep and the odd bit lines BLo1 to BLop by arrangement in a column direction (that is, +Y direction) may be included in the memory block BLK11.

Figure 16:
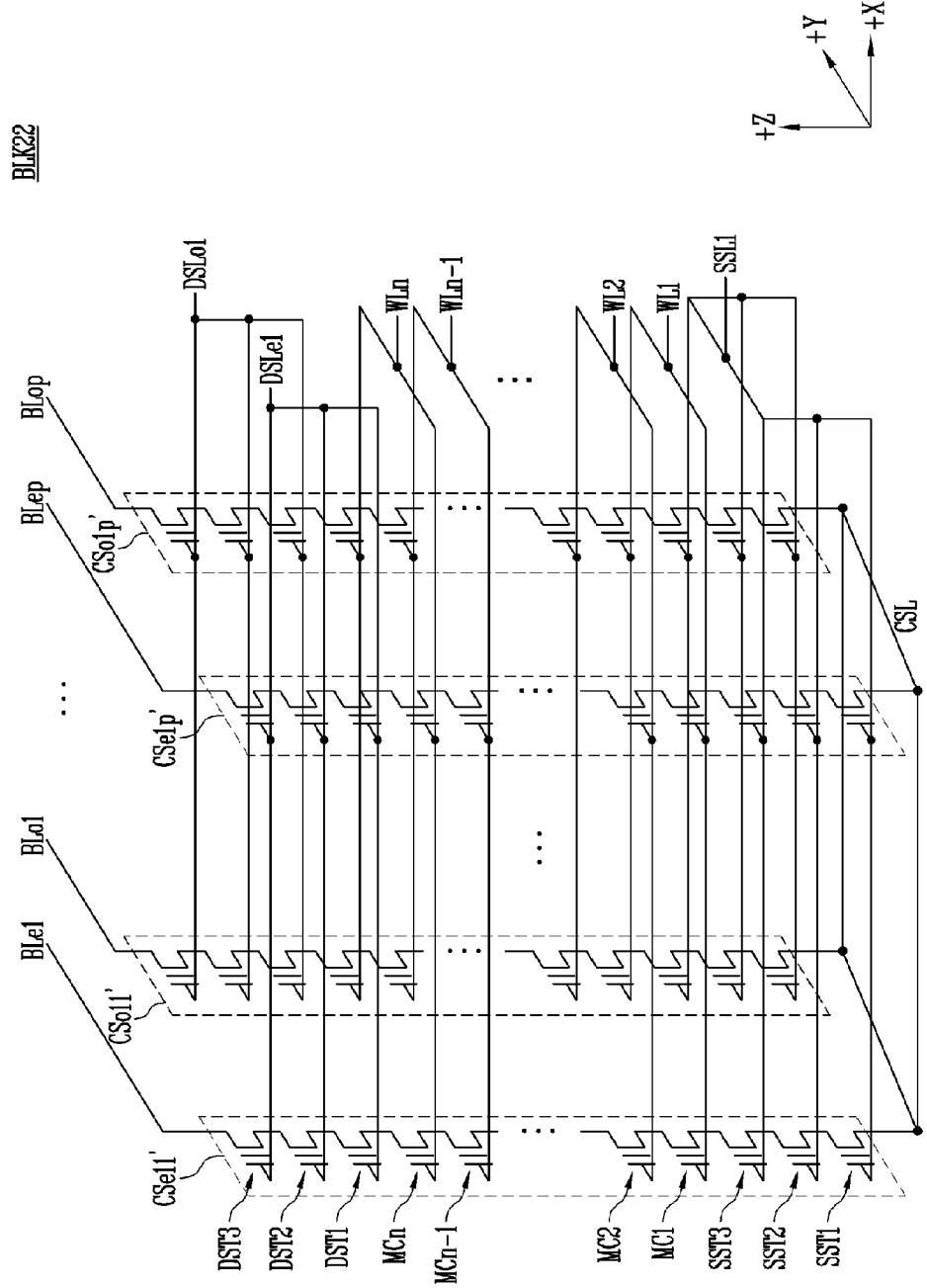
FIG. 16 is a circuit diagram illustrating a representation of one of the memory blocks illustrated in FIG. 2 according to an embodiment.

FIG. 16 is a circuit diagram illustrating a representation of one (BLK1) of the memory blocks BLK1 to BLKz illustrated in FIG. 2 according to an embodiment.

Referring to FIG. 16, the memory block BLK22 may include even cell strings CSe11' to CSe1$p$' and odd cell strings CSo11' to CSo1$p$'.

Each of the even cell strings CSe11' to CSe1$p$' and the odd cell strings CSo11' to CSo1$p$' may include at least one of source selection transistors SST1 to SST3, first to n-th memory cells MC1 to MCn, and at least one of drain selection transistors DST1 to DST3.

The even cell strings CSe11' to CSe1$p$' and the odd cell strings CSo11' to CSo1$p$' illustrated in FIG. 16 are a modified embodiment of the cell strings CS11' to CS1$m$' of a first row illustrated in FIG. 4.

First to p-th even cell strings CSe11' to CSe1$p$' are connected to first to p-th even bit lines BLe1 to BLep, respectively. First to p-th odd cell strings CSo11' to CSo1$p$' are connected to first to p-th odd bit lines BLo1 to BLop, respectively. The even cell strings CSe11' to CSe1$p$' and the odd cell strings CSo11' to CSo1$p$' are commonly connected to a common source line CSL.

First to n-th memory cells MC1 to MCn of each cell string are connected to first to n-th word lines WL1 to WLn.

Drain selection transistors DST1 to DST3 of the first to p-th even cell strings CSe11' to CSe1$p$' are connected to a first even drain selection line DSLe1. Drain selection transistors DST1 to DST3 of the first to p-th odd cell strings CSo11' to CSo1$p$' are connected to a first odd drain selection line DSLo1.

Source selection transistors SST1 to SST3 of the even cell strings CSe1' to CSe1$p$' and the odd cell strings CSo11' to CSo1$p$' are connected to one source selection line SSL1.

As a result, the even cell strings and the odd cell strings are connected to different drain selection lines DSLe1 and DSLo1, and connected to the same source selection line SSL1.

The memory block BLK22 illustrated in FIG. 16 includes a similar equivalent circuit as the memory block BLK11 illustrated in FIG. 15 except the omission of the pipe transistor PT in each cell string.

Hereinafter, for convenience of explanation, the embodiments will be explained based on the memory block BLK11 illustrated in FIG. 15.

Figure 17:
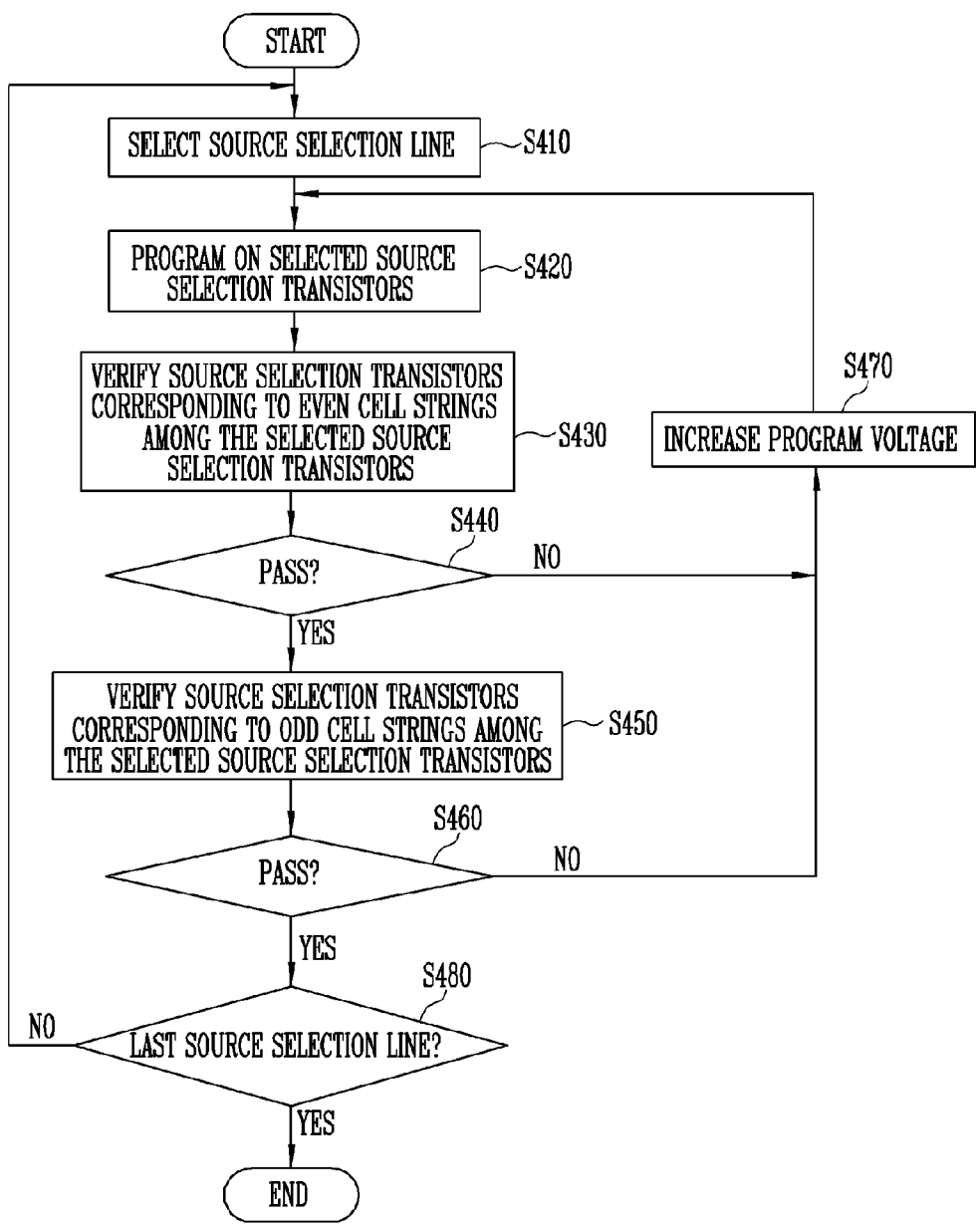
FIG. 17 is a flowchart illustrating a program operation of source selection transistors of even cell strings and odd cell strings according to an embodiment.

FIG. 17 is a flowchart illustrating a program operation of source selection transistors SST1 to SST3 of even cell strings CSe11 to CSe1$p$ and odd cell strings CSo11 to CSo1$p$ according an embodiment.

Referring to FIGS. 15 and 17, in Operation S410, a source selection line SSL1 is selected. In Operation S420 to S460, the program operation is performed on the source selection transistors SST1 to SST3 of the cell string group connected to the selected source selection line SSL1.

Firstly, in Operation S420, a program is performed on the selected source selection transistors SST1 to SST3. The selected source selection line SSL1 is biased with the program voltage, and the common source line CSL is biased with a reference voltage. The selected source selection line SSL1 is connected to the even cell strings CSe11 to CSe1$p$ and the odd cell strings CSo11 to CSo1$p$. Thus, threshold voltages of the source selection transistors SST1 to SST3 included in the cell strings CSe11 to CSe1$p$, CSo11 to CSo1$p$ will be increased.

In Operations S430 and S460, a verification on the selected source selection transistors SST1 to SST3 is performed.

In Operation S430, a verification on source selection transistors SST1 to SST3 included in the even cell strings CSe11 to CSe1$p$ among the selected source selection transistors SST1 to SST3 is performed.

A verification voltage is applied to the selected source selection line SSL1. Here, a predetermined voltage or current is applied to the even bit lines BLe1 to BLep, and a voltage to turn on the memory cells MC1 to MCn and the pipe transistors PT is applied to the word lines WL1 to WLn and the pipe line PL.

An even drain selection line DSLe1 receives a voltage to turn on drain selection transistors DST1 to DST3 of the even cell strings CSe11 to CSe1$p$. An odd drain selection line DSLo1 is biased, and thus turns off drain selection transistors DST1 to DST3 of the odd cell strings CSo11 to CSo1$p$.

Threshold voltages of the source selection transistors SST1 to SST3 included in the even cell strings CSe11 to CSe1$p$ are read based on whether the voltage or current supplied to the even bit lines BLe1 to BLep decreases.

In Operation S440, when the verification result is fail, Operation S470 is performed. A voltage generator 122 is set, and thus an increased program voltage is generated during the program. When the verification result is passed, Operation S450 is performed.

In Operation S450, a verification on source selection transistors SST1 to SST3 included in the odd cell strings CSo11 to CSo1$p$ among the selected source selection transistors SST1 to SST3 is performed.

A verification voltage is applied to the selected source selection line SSL1. Here, a predetermined voltage or current is applied to the odd bit lines BLo1 to BLop, and a voltage to turn on the memory cells MC1 to MCn and the pipe transistors PT is applied to the word lines WL1 to WLn and the pipe line PL. An odd drain selection line DSLo1 is biased as a voltage to turn on the drain selection transistors DST1 to DST3 included in the odd cell strings CSo11 to CSo1$p$. An even drain selection line DSLe1 is biased as a voltage to turn off the drain selection transistors DST1 to DST3 included in the even cell strings CSe11 to CSe1$p$. Threshold voltages of the source selection transistors SST1 to SST3 included in the odd cell strings CSo11 to CSo1$p$ are read based on whether the voltage or current supplied to the odd bit lines BLo1 to BLop decreases.

In Operation S460, when the verification result is fail, Operation S470 is performed. When the verification result is a pass, Operation S480 is performed. As a result, Operation S480 is performed only when all of the verification on the source selection transistors SST1 to SST3 of the even cell strings CSe11 to CSe1$p$ and the verification on the source selection transistors SST1 to SST3 of the odd cell strings CSo11 to CSo1$p$ are passed.

In Operation S480, next source selection line is selected (Operation S410) or the program operation is completed based on whether the selected source selection line SSL1 is a last source selection line.

Figure 18:
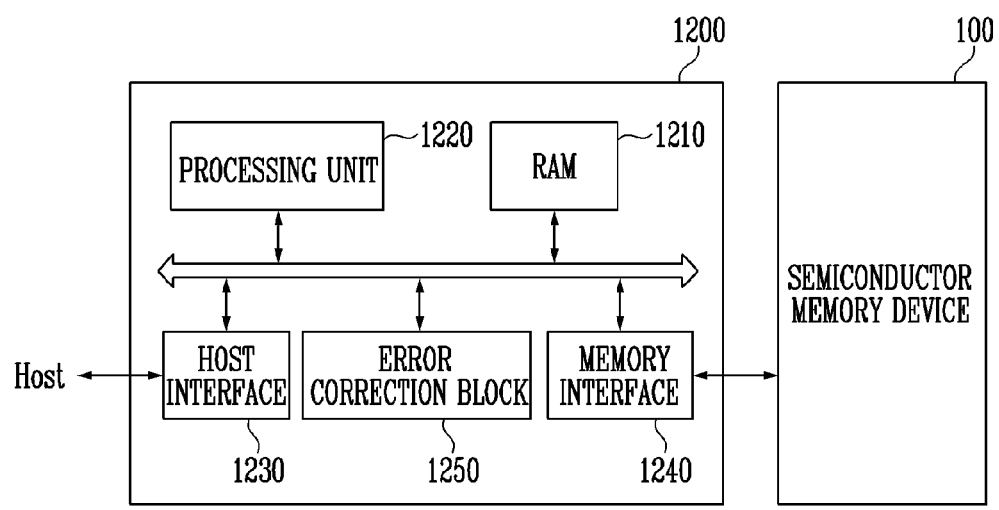
FIG. 18 is a block diagram illustrating a representation of a memory system including the semiconductor memory device illustrated in FIG. 1.

FIG. 18 is a block diagram illustrating a representation of a memory system 1000 including the semiconductor memory device 100 illustrated in FIG. 1.

Referring to FIG. 18, the memory system 1000 may include the semiconductor memory device 100 and a controller 1200.

The semiconductor memory device 100 may have the same structure and operation as illustrated in FIG. 1. Hereinafter, any repetitive explanations will be omitted.

The controller 1200 is connected to a host Host and the semiconductor memory device 100. The controller 1200 accesses the semiconductor memory device 100 in response to a request from the host Host. For example, the controller 1200 is configured to control read, write, erase, and background operations of the semiconductor memory device 100. The controller 1200 is configured to provide an interface between the semiconductor memory device 100 and the host Host. The controller 1200 is configured to drive firmware, which is configured to control the semiconductor memory device 100.

The controller 1200 may include a random access memory (RAM) 1210, a processing unit 1220, a host interface 1230, a memory interface 1240, and an error correction block 1250.

The RAM 1210 is configured to be used as at least one of an operation memory of the processing unit 1220, a cache memory interposed between the semiconductor memory device 100 and the host Host, and a buffer memory interposed between the semiconductor memory device 100 and the host Host.

The processing unit 1220 controls overall operations of the controller 1200.

The host interface 1230 may include a protocol configured to perform data exchange between the host Host and the controller 1200. In an embodiment, the controller 1200 is configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (ID) protocol, a private protocol, and/or the like.

The memory interface 1240 interfaces with the semiconductor memory device 100. For example, the memory interface 1240 may include a NAND interface or a NOR interface.

The error correction block 1250 detects and corrects an error in data received from the semiconductor memory device 100 using an error correction code (ECC).

The semiconductor memory device 100 explained with reference to FIG. 1 is provided, and thus the memory system 1000 having improved reliability may be provided.

The controller 1200 and the semiconductor memory device 100 may be integrated into one semiconductor device. In an embodiment, the controller 1200 and the semiconductor memory device 100 are integrated into one semiconductor device, and thus constitute a memory card. For example, the controller 1200 and the semiconductor memory device 100 are integrated to one semiconductor device, and thus constitute a memory card such as a PC card, a personal computer memory card international association (PCMCIA), a compact flash card (CF), a smart media card (SM, SMC), a memory stick, a multimedia card (MMC, RS-MMC, MMCmicro), an SD card (SD, miniSD, microSD, SDHC), a universal flash storage device (UFS), etc.

The controller 1200 and the semiconductor memory device 100 are integrated into one semiconductor device, and thus constitute a solid state drive (SSD). The SSD includes a storage media configured to store data in a semiconductor memory. When the memory system 1000 is used as the SSD, an operation speed of the host Host connected to the memory system 1000 is greatly increased.

In an embodiment, the memory system 1000 may be supplied to one of a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, a digital video player, a device to receive or transmit information in wireless environment, one of various electronic devices included in a home network, one of various electronic devices included in a computer network, one of various electronic devices included in telematics network, an RFID device, one of various structural parts included in a computing system, and/or the like.

In an embodiment, the semiconductor memory device 100 or the memory system 1000 may be mounted as a package having various shapes. For example, the semiconductor memory device 100 or the memory system 1000 may be mounted by packaging as a type of a package on package (PoP), ball grid arrays (BGAs), chip scale packages (CSPs), a plastic leaded chip carrier (PLCC), a plastic dual in line package (PDIP), a die in wafer pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), and/or the like.

Figure 19:
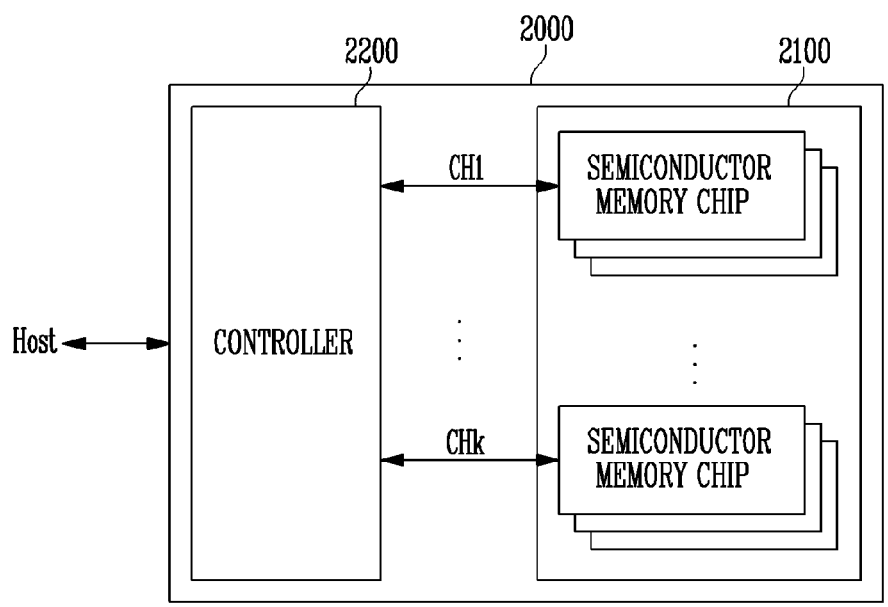
FIG. 19 is a block diagram illustrating a representation of an applicable example of the memory system illustrated in FIG. 18.

FIG. 19 is a block diagram illustrating a representation of an applicable example (2000) of a memory system 1000 illustrated in FIG. 18.

Referring to FIG. 19, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 19, the plurality of the groups are described to communicate with the controller 2200 through first to k-th channels CH1 to CHk, respectively. Each semiconductor memory chip includes the same structure and operation as one of the semiconductor memory device 100 illustrated in FIG. 1.

Each group is configured to communicate with the controller 2200 through one common channel. The controller 2200 is configured to be substantially the same as the controller 1200 illustrated in FIG. 18, and to control the plurality of memory chips of the semiconductor memory device 2100 through the plurality of the channels CH1 to CHk.

In FIG. 19, the plurality of the semiconductor memory chips connected to one channel are explained. However, it will be understood that the memory system 2000 may be changed so that one semiconductor memory chip is connected to one channel.

Figure 20:
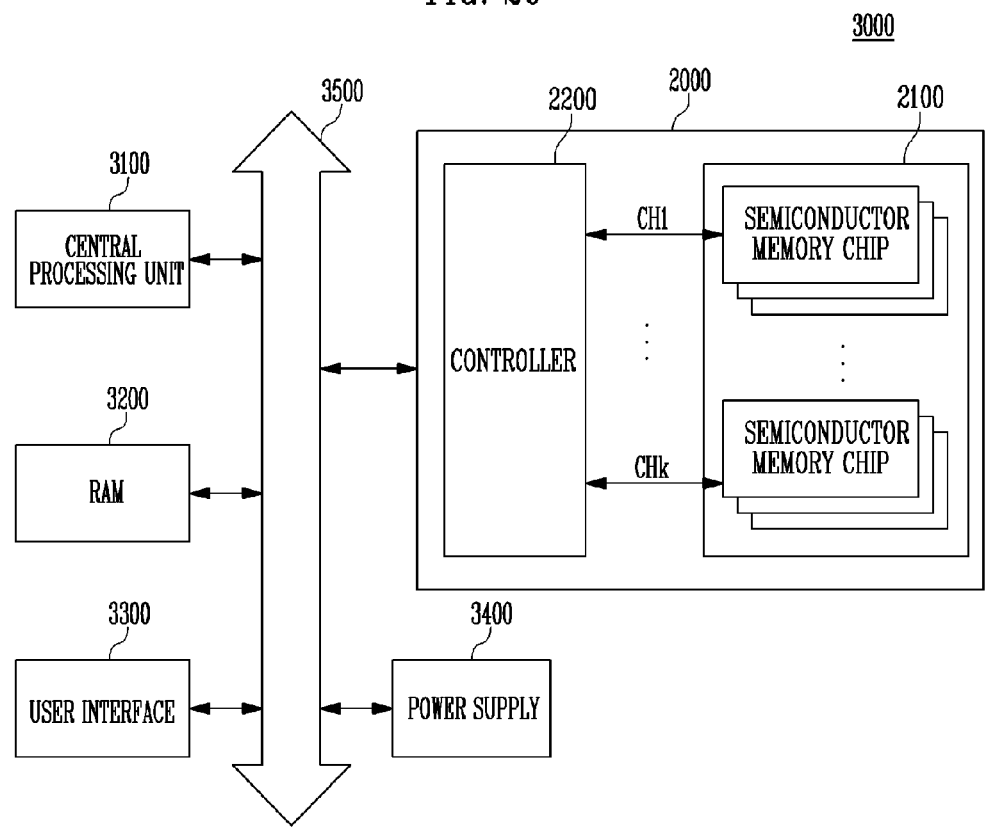
FIG. 20 is a block diagram illustrating a representation of a computing system including the memory system explained with reference to FIG. 19.

FIG. 20 is a block diagram illustrating a representation of a computing system 3000 including the memory system 2000 explained with reference to FIG. 19.

Referring to FIG. 20, the computing system 3000 may include a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided from the user interface 3300 or processed by the central processing unit 3100 is stored in the memory system 2000.

In FIG. 20, the semiconductor memory device 2100 connected to the system bus 3500 through the controller 2200 is described. However, the semiconductor memory device 2100 may be configured to be directly connected to the system bus 3500. In these examples, the operation of the controller 2200 may be performed by the central processing unit 3100 and the RAM 3200.

In FIG. 20, the memory system 2000 illustrated in FIG. 19 is provided. However, the memory system 2000 may be substituted by the memory system 1000 illustrated in FIG. 18. In an embodiment, the computing system 3000 may include both of the memory systems 1000 and 2000 illustrated in FIGS. 18 and 19.

According to the various examples of embodiments, the semiconductor memory device may program the source selection transistors in the memory cell array. The program operation on the source selection transistors is performed, and thus the threshold voltages of the source selection transistors may be disposed within a desired voltage range. Thus, reliability of the semiconductor memory device may be improved.

According to the various examples of the embodiments, the semiconductor memory device, which may have increased reliability, and the method of operating the same are provided.

Although the various examples of embodiments are explained, it will be apparent to those skilled in the art that various modifications can be made to the above-described embodiments without departing from the spirit or scope of the application. Here, the essential technical scope of the application is disclosed in the appended claims, and it is intended that the present application covers all such modifications provided they come within the scope of the claims and their equivalents.

What is claimed is:

1. A semiconductor memory device comprising:
a plurality of cell strings, each of the plurality of the cell strings including a first source selection transistor connected to a common source line, memory cells connected to the common source line through the first source selection transistor and a drain selection transistor connected between the memory cells and a bit line;
a first source selection line connected to the first source selection transistors included in the plurality of the cell strings;
a plurality of word lines connected to the memory cells included in each of the plurality of cell strings, respectively;
a drain selection line connected to the drain selection transistors included in the plurality of the cell strings; and
a peripheral circuit configured to control the plurality of cell strings,
wherein the peripheral circuit is configured to perform a program on the first source selection transistors connected to the first source selection line by applying a program voltage to the first source selection line, and by applying a turn-off voltage to the drain selection line to turn-off the drain selection transistors included in the plurality of the cell strings, or floating the drain selection line.

2. The semiconductor memory device of claim 1,
wherein each of the plurality of the cell strings includes a second source selection transistor connected between the memory cells and the common source line, and
the peripheral circuit applies a program prohibition voltage to a second source selection line connected to the second source selection transistors included in the plurality of cell strings to prohibit the program on the second source selection transistors while the program voltage is applied to the first source selection line, and
wherein the program prohibition voltage is less than the program voltage.

3. The semiconductor memory device of claim 1,
wherein each of the plurality of the cell strings includes a second source selection transistor connected between the memory cells and the common source line, and
the peripheral circuit floats a second source selection line connected to the second source selection transistors included in the plurality of cell strings to prohibit the program on the second source selection transistors while the program voltage is applied to the first source selection line.

4. The semiconductor memory device of claim 1, wherein during the program, the peripheral circuit applies the reference voltage to bit lines connected to the plurality of the cell strings, the drain selection line, and the plurality of the word lines.

5. The semiconductor memory device of claim 1, wherein during the program, the peripheral circuit floats bit lines connected to the plurality of the cell strings, the drain selection line, and the plurality of the word lines.

6. The semiconductor memory device of claim 1, wherein each of the plurality of the cell strings comprises a pipe gate, the pipe gate being connected between first memory cells of the memory cells and second memory cells of the memory cells, and
during the program, the peripheral circuit biases a pipe line connected to the pipe gate to a reference voltage or floats the pipe line connected to the pipe gate.

7. The semiconductor memory device of claim 1, wherein after the program, the peripheral circuit verifies whether a threshold voltage of each of the first source selection transistors connected to the first source selection line is equal to or greater than a first verification voltage.

8. The semiconductor memory device of claim 7, wherein the peripheral circuit is configured to:
complete the program when a threshold voltage of each of the first source selection transistors is equal to or greater than the first verification voltage; and
program again the first source selection transistors using an increased program voltage higher than the program voltage when at least one of the first source selection transistors has a threshold voltage less than the first verification voltage.

9. The semiconductor memory device of claim 1, wherein first cell strings of the plurality of the cell strings are connected to first bit lines,
second cell strings of the plurality of the cell strings are connected to second bit lines,
after the program, the peripheral circuit performs a first verification on the first source selection transistors included in the first cell strings, and the peripheral circuit performs a second verification on the first source selection transistors included in the second cell strings.

10. The semiconductor memory device of claim 9, wherein when at least one of the first verification and the second verification has failed, the peripheral circuit applies an increased program voltage higher than the program voltage to the first source selection lines to, again, program the first source selection transistors.

11. A method of operating a semiconductor memory device, including a plurality of cell strings, each of the plurality of cell strings including a plurality of memory cells and a plurality of source selection transistors connected between the plurality of memory cells and a common source line, the plurality of source selection transistors including a first source selection transistor and a second source selection transistor, the method comprising:
applying a reference voltage to the common source line;
applying a program voltage to a first source selection line connected to the first source selection transistors included in the plurality of the cell strings to perform a program on the first source selection transistors; and
floating a second source selection line connected to the second source selection transistors included in the plurality of the cell strings during the applying of the program voltage to the first source selection line.

12. The method of claim 11, further comprising:
after the program,
programming again the first source selection transistors connected to the first selected source selection line using an increased program voltage higher than the program voltage when at least one of the first source selection transistors has a threshold voltage less than a first verification voltage.

13. The method of claim 11,
wherein each of the plurality of the cell strings includes a drain selection transistor connected between the plurality of memory cells and a bit line, and during the applying of the program voltage to the first source selection line, a turn-off voltage is applied to a drain selection line to turn off the drain selection transistors connected to the drain selection line and included in the plurality of the cell strings, or the drain selection line is floated.

14. The method of claim 13,
wherein each of the plurality of the cell strings comprises a pipe gate, the pipe gate being connected between first memory cells of the plurality of memory cells and second memory cells of the plurality of memory cells, and
a pipe line connected to the pipe gates included in the plurality of the cell strings is biased to a reference voltage or floated during the applying of the program voltage to the first source selection line.

15. A semiconductor memory device including a 3-dimensional memory cell array structure, the semiconductor memory device comprising:
a cell string including:
a plurality of memory cells;
a first source selection transistor connected between the plurality of memory cells and a common source line; and
a plurality of word lines connected to the plurality of memory cells respectively;
a first source selection line connected to a gate of the first source selection transistor included in the cell string; and
a peripheral circuit connected to the plurality of word lines, the common source line and the first source selection line,
wherein the peripheral circuit is configured to perform a program on the first source selection transistor by applying a program voltage to the first source selection line, by applying a reference voltage to the common source line, and by applying a plurality of voltages to the plurality of word lines to turn-off at least one of the plurality of memory cells or floating at least one of the plurality of word lines.

16. The semiconductor memory device of claim 15, wherein the cell string further includes a second source selection transistor connected between the plurality of memory cells and the common source line and connected to a second source selection line, and
the second source selection line is floated while the program voltage is applied to the first source selection line.

17. The semiconductor memory device of claim 15, wherein the cell string further includes a drain selection transistor connected between a bit line and the plurality of memory cells, and
a ground voltage is applied to a drain selection line connected to the drain selection transistor while the program voltage is applied to the first source selection line.

18. The semiconductor memory device of claim 15, wherein after the program, the peripheral circuit verifies whether a threshold voltage of each of the first source selection transistors connected to the first source selection line is equal to or greater than a first verification voltage.

19. The semiconductor memory device of claim 18, wherein the peripheral circuit is configured to program again the first source selection transistors using an increased program voltage higher than the program voltage when at least one of the first source selection transistors has a threshold voltage less than the first verification voltage.

20. The semiconductor memory device of claim 15, wherein each of the plurality of the cell strings comprises a pipe gate, the pipe gate being connected between first memory cells among the plurality of memory cells and second memory cells among the plurality of memory cells, and
while the program voltage is applied to the first source selection line, the peripheral circuit biases a pipe line connected to the pipe gate to a reference voltage or floats the pipe line connected to the pipe gate.

* * * * *